US012068575B2

(12) United States Patent
Chen et al.

(10) Patent No.: US 12,068,575 B2
(45) Date of Patent: Aug. 20, 2024

(54) LASER DEVICE AND METHOD OF MANUFACTURING THE SAME

(71) Applicant: PHOSERTEK CORPORATION, Hsinchu (TW)

(72) Inventors: Yu-Chen Chen, Hsinchu (TW); Chien-Hung Lin, Hsinchu (TW); Bo-Tsun Chou, Hsinchu (TW); Chih-Yuan Weng, Hsinchu (TW); Kuo-Jui Lin, Hsinchu (TW)

(73) Assignee: PHOSERTEK CORPORATION, Hsinchu (TW)

( * ) Notice: Subject to any disclaimer, the term of this patent is extended or adjusted under 35 U.S.C. 154(b) by 367 days.

(21) Appl. No.: 17/241,584

(22) Filed: Apr. 27, 2021

(65) Prior Publication Data
US 2021/0344165 A1 Nov. 4, 2021

Related U.S. Application Data

(63) Continuation-in-part of application No. 17/145,691, filed on Jan. 11, 2021, now Pat. No. 11,509,115.
(Continued)

(30) Foreign Application Priority Data

Apr. 29, 2020 (TW) .................................. 109205104

(51) Int. Cl.
*H01S 5/026* (2006.01)
*H01S 5/042* (2006.01)
(Continued)

(52) U.S. Cl.
CPC .......... *H01S 5/026* (2013.01); *H01S 5/04256* (2019.08); *H01S 5/11* (2021.01); *H01S 5/18361* (2013.01); *H01S 5/343* (2013.01)

(58) Field of Classification Search
CPC ........................................................ H01S 5/11
(Continued)

(56) References Cited

U.S. PATENT DOCUMENTS

| 6,674,778 B1 | 1/2004 | Lin et al. |
| 8,416,826 B2 | 4/2013 | Nagatomo et al. |

(Continued)

FOREIGN PATENT DOCUMENTS

| CN | 1218996 C | 6/2002 |
| CN | 1773736 C | 4/2009 |

(Continued)

OTHER PUBLICATIONS

ISR of WO2022095455A1 dated Sep. 22, 2021.
(Continued)

*Primary Examiner* — Tuan N Nguyen
(74) *Attorney, Agent, or Firm* — Muir Patent Law, PLLC

(57) ABSTRACT

A laser device includes a substrate, a first waveguiding layer, an active layer, a second waveguiding layer, a contact layer, an insulating layer, a light-transmissive conducting layer, a first electrode, and a second electrode. The first waveguiding layer, the active layer, the second waveguiding layer, and the contact layer form an epitaxy structure having a first platform and a second platform. The first platform has multiple holes to form a photonic crystal structure. The insulating layer is over an upper surface and a sidewall surface of the first platform, and over an upper surface of the second platform. The sidewall surface passes through the contact layer, the second waveguiding layer, and the active layer. The light-transmissive conducting layer connects to the photonic crystal structure through an aperture of the insulating layer. The first electrode has an opening corresponding to the aperture. The second electrode is under the substrate.

20 Claims, 24 Drawing Sheets

Related U.S. Application Data

(60) Provisional application No. 63/111,065, filed on Nov. 8, 2020.

(51) Int. Cl.
    *H01S 5/11*     (2021.01)
    *H01S 5/183*     (2006.01)
    *H01S 5/343*     (2006.01)

(58) Field of Classification Search
    USPC ........................................................ 372/38.05
    See application file for complete search history.

(56) References Cited

U.S. PATENT DOCUMENTS

| | | |
|---|---|---|
| 8,442,086 B2 | 5/2013 | Nagatomo |
| 9,048,378 B2 | 6/2015 | Shatalov et al. |
| 9,583,914 B2 | 2/2017 | Hirose et al. |
| 9,893,493 B2 | 2/2018 | Saito et al. |
| 10,340,659 B1 * | 7/2019 | Lin .................... H01S 5/18394 |
| 10,404,036 B1 | 9/2019 | Lu et al. |
| 10,404,037 B2 | 9/2019 | Higuchi et al. |
| 10,840,673 B1 | 11/2020 | Lin et al. |
| 11,139,636 B2 | 10/2021 | Lin et al. |
| 11,509,115 B2 | 11/2022 | Lin et al. |
| 11,637,409 B2 | 4/2023 | Sugiyama et al. |
| 2003/0043870 A1 | 3/2003 | Shchukin et al. |
| 2003/0235229 A1 * | 12/2003 | Deng .................... H01S 5/183 |
| | | 372/96 |
| 2005/0152424 A1 | 7/2005 | Khalfin et al. |
| 2006/0020031 A1 | 1/2006 | Berlin |
| 2006/0126695 A1 * | 6/2006 | Koyama ................ H01S 5/0264 |
| | | 372/50.124 |
| 2006/0171440 A1 | 8/2006 | Ledentsov et al. |
| 2007/0097680 A1 | 5/2007 | Cao et al. |
| 2007/0201527 A1 | 8/2007 | Hori et al. |
| 2009/0196319 A1 | 8/2009 | Hori et al. |
| 2010/0103972 A1 | 4/2010 | Saito et al. |
| 2012/0072931 A1 | 3/2012 | Imada et al. |
| 2017/0047481 A1 | 2/2017 | Bonar et al. |
| 2019/0067900 A1 | 5/2019 | Bhattacharya et al. |
| 2019/0252855 A1 | 9/2019 | Lu et al. |

FOREIGN PATENT DOCUMENTS

| | | |
|---|---|---|
| CN | 103107482 A | 5/2013 |
| CN | 107112389 B | 6/2019 |
| CN | 110535033 B | 5/2021 |
| TW | M569067 U | 10/2018 |
| TW | M588387 U | 12/2019 |

OTHER PUBLICATIONS

Office Action of CN113572018A dated Jun. 29, 2023.
Office Action of CN113572018A dated Nov. 10, 2023.
Office Action of TW202220316A1.
Notice of References Cited (PTO-892) of U.S. Pat. No. 10,340,659B1.
Notice of References Cited (PTO-892) of U.S. Pat. No. 10,404,036B1.
Notice of References Cited (PTO-892) of U.S. Pat. No. 10,840,673B1.
Notice of References Cited (PTO-892) of U.S. Pat. No. 11,139,636B2.

\* cited by examiner

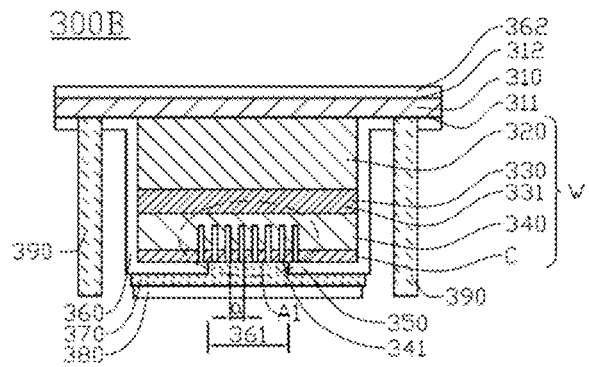
FIG. 19
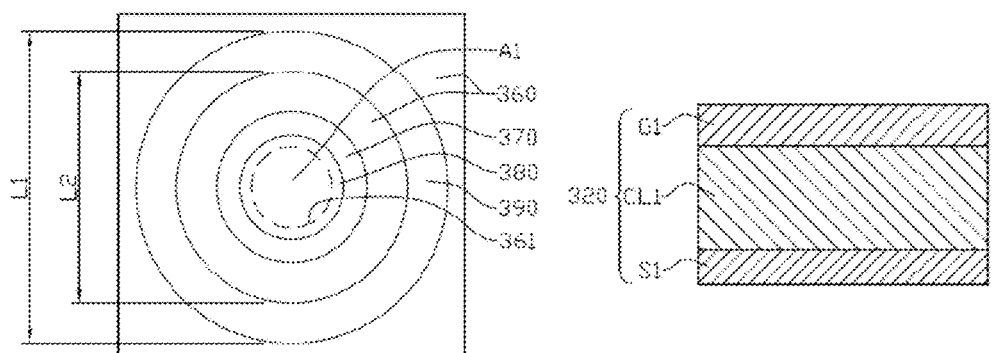
FIG. 20
FIG. 21
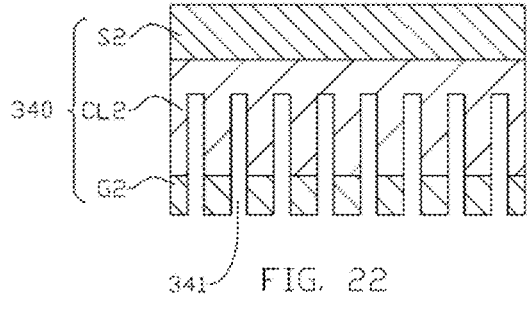
FIG. 22
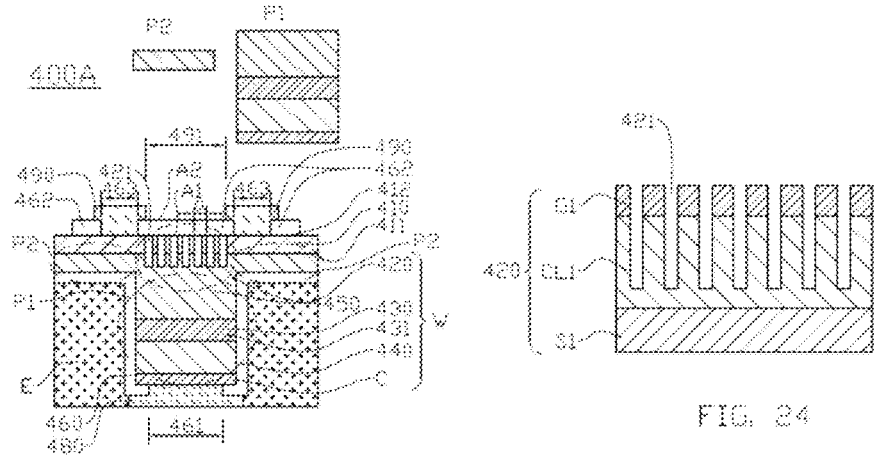
FIG. 23
FIG. 24

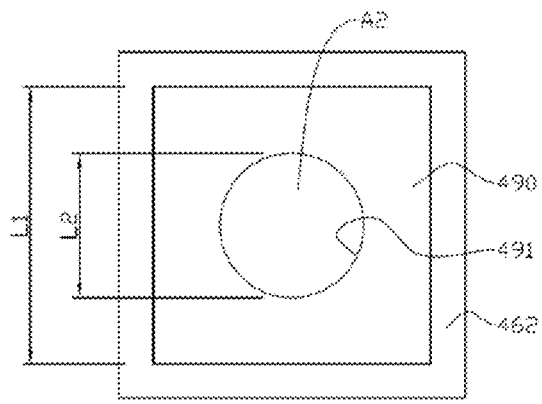
FIG. 27
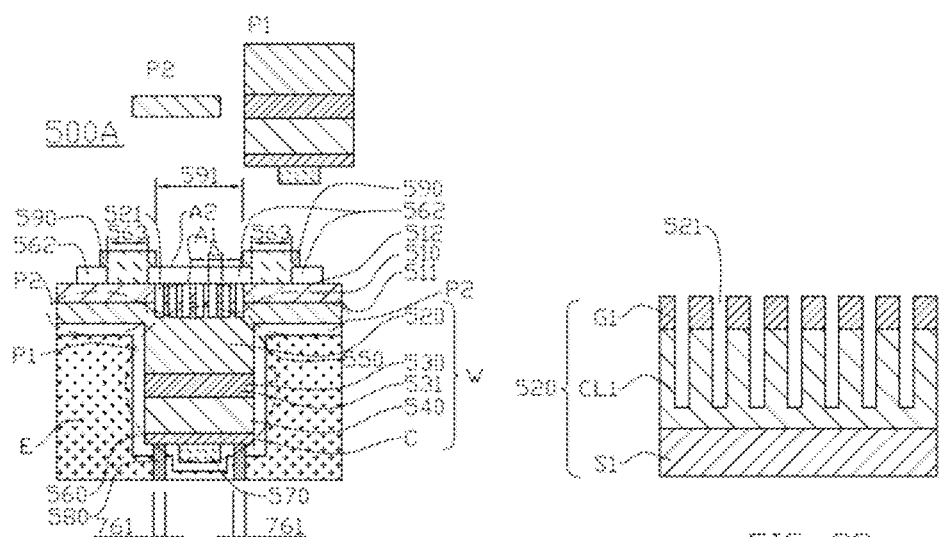
FIG. 28
FIG. 29
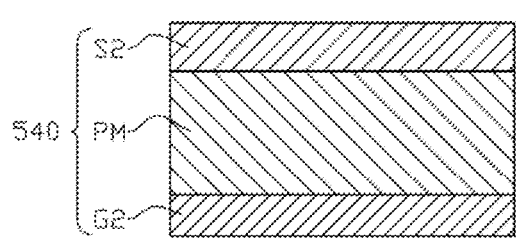
FIG. 30

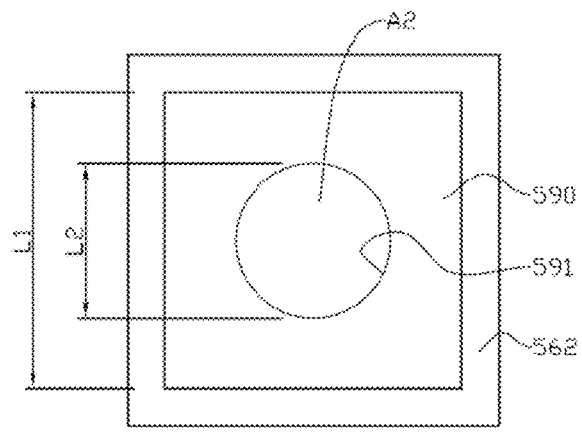
FIG. 32
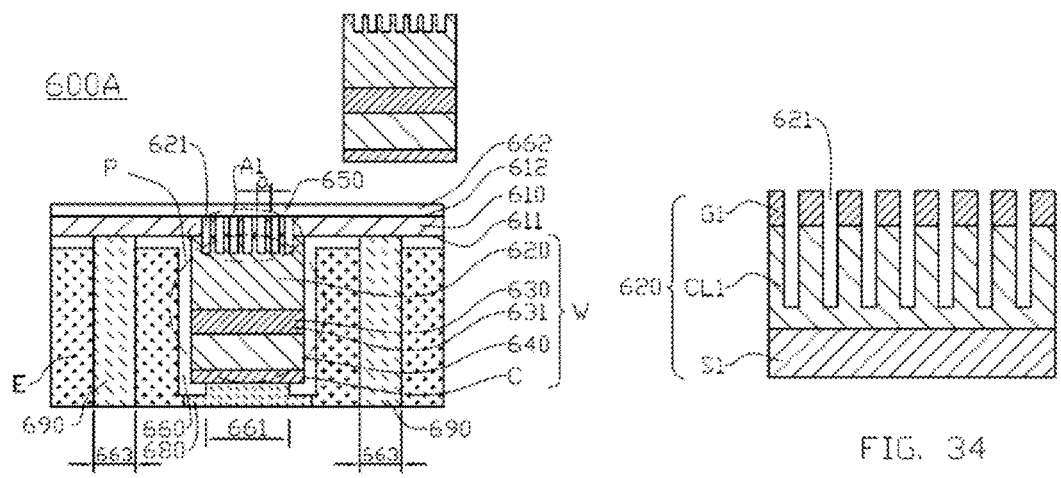
FIG. 33
FIG. 34
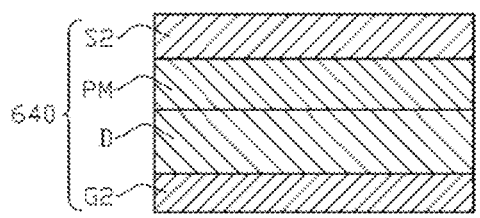
FIG. 35

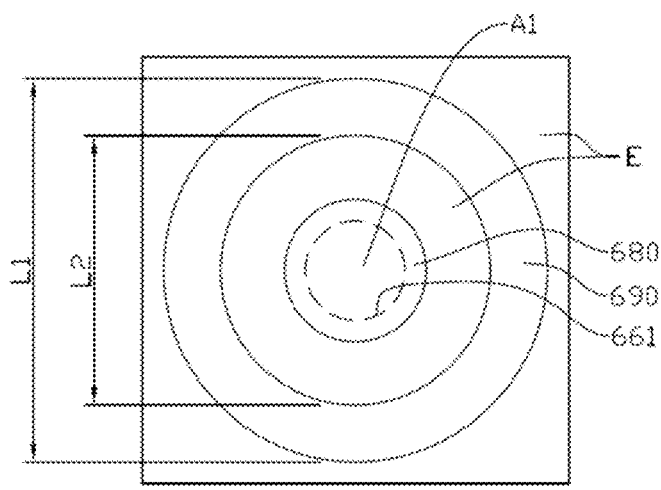
FIG. 37
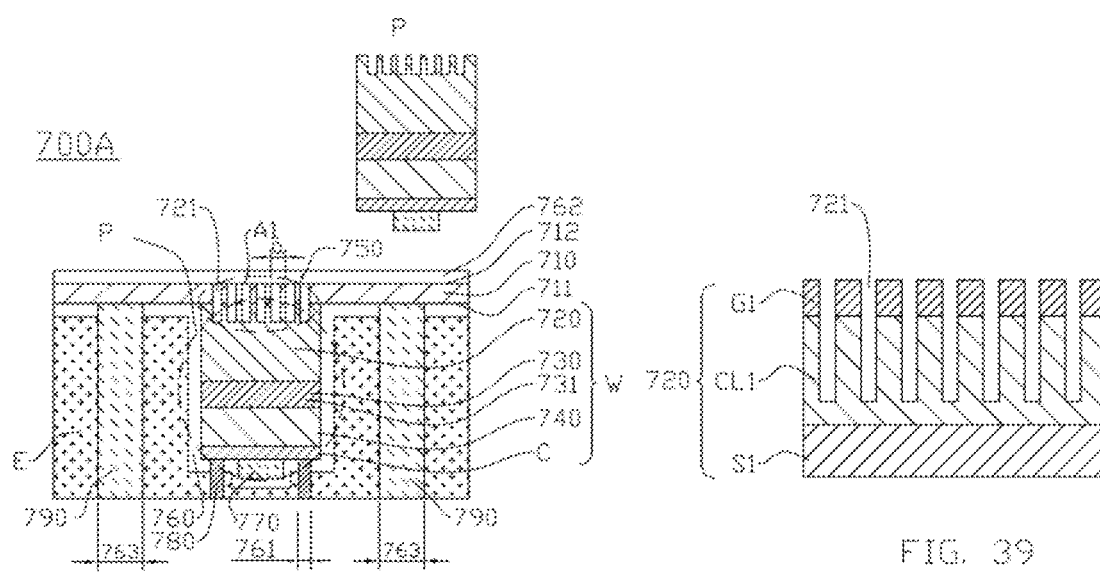
FIG. 38
FIG. 39
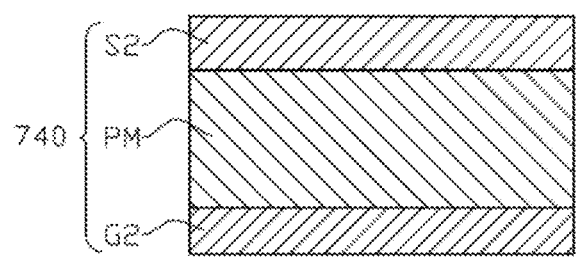
FIG. 40

LASER DEVICE AND METHOD OF MANUFACTURING THE SAME

CROSS-REFERENCE TO RELATED APPLICATION

This application claims the benefit of priority to Taiwan Patent Application No. 109205104 filed on Apr. 29, 2020, China Patent Application No. 202011496231.8 filed on Dec. 17, 2020, U.S. patent application Ser. No. 17/145,691 filed on Jan. 11, 2021 (of which this application is a Continuation-in-Part), and U.S. Provisional Patent Application Ser. No. 63/111,065 filed on Nov. 8, 2020. The entirety of the above-mentioned patent applications are hereby incorporated by reference herein in their entirety and made a part of this specification.

TECHNICAL FIELD

The disclosure relates generally to a laser device, and more particularly, to an electrically pumped photonic crystal surface emitting laser device.

BACKGROUND

Photonic crystals are periodic metamaterials that can be fabricated by modern technology with features similar to solid crystals. In solid crystals, a band structure can be discovered from its dispersion relation; therefore, the same structure can be seen in photonic crystals as well. Furthermore, photonic crystals have forbidden band where electromagnetic waves with specific frequency cannot exist within as solid crystals have bandgaps. With the similarities, photonic crystals are able to control transmission of lights and therefore have been applied to photonic crystal lasers, photonic crystal fibers and similar applications in the field.

Photonic crystal lasers can be mainly divided into two types—defect lasers and band-edge lasers. Defect lasers are fabricated by creating one or a few holes among lattices of the photonic crystals to confine the electromagnetic waves and to form a cavity within the structure. The laser beams emitted from defect lasers have high quality and low threshold. On the other hand, band-edge lasers can produce slow light to lengthen the periodicity of the photons within the photonic crystals and to enhance the interaction between the photons and the gain media. In addition, such lasers do not confine the resonance region within a small volume but widen the resonance region to the entire photonic crystal for coherent oscillation in large area; and the laser emitted from the band-edge lasers diffract out from a surface of the photonic crystals to achieve surface-emission. Such lasers also have features of emission with a large area and narrow divergence angle, high power output and easy fabrication of 2-dimensional laser array.

The photonic crystal lasers are divided into electrically pumped and light excited types. Light excited lasers have high power laser source input to produce a large amount of electron-hole pairs to produce laser beams, while electrically pumped lasers have external electricity source to produce laser beams. Practically, electrically pumped photonic crystal lasers are dominant in the field. However, input of electric currents is difficult due to the lattice structure of photonic crystals; the routes for light transmission and distribution of the carriers are issues to be considered.

SUMMARY

One of the broader forms of the present disclosure involves an electrically pumped photonic crystal surface emitting laser device. The laser device comprises a substrate having an inner surface and an outer surface; a first waveguiding layer over the inner surface of the substrate; an active layer having a quantum structure over the first waveguiding layer; a second waveguiding layer over the active layer; a contact layer over the second waveguiding layer, wherein the first waveguiding layer, the active layer, the second waveguiding layer, and the contact layer form an epitaxy structure, the epitaxy structure having a first platform and a second platform, the first platform having multiple holes to form a photonic crystal structure; an insulating layer over an upper surface and a sidewall surface of the first platform, and over an upper surface of the second platform, wherein the sidewall surface of the first platform passes through the contact layer, the second waveguiding layer, and the active layer, and wherein the insulating layer has an aperture corresponding to the photonic crystal structure; a light-transmissive conducting layer over the insulating layer and connecting to the photonic crystal structure through the aperture of the insulating layer; a first electrode over the light-transmissive conducting layer, wherein the first electrode has an opening corresponding to the aperture of the insulating layer; and a second electrode under the outer surface of the substrate.

In some embodiments, the first waveguiding layer comprises a graded-index layer, a cladding layer, and a separate confinement heterostructure.

In some embodiments, the first waveguiding layer comprises a graded-index layer, a distributed Bragg reflector structure, a phase matching layer, and a separate confinement heterostructure.

In some embodiments, the second waveguiding layer comprises a graded-index layer, a cladding layer, and a separate confinement heterostructure.

In some embodiments, the holes are arranged in 2-dimension.

In some embodiments, the sidewall surface of the first platform further passes through at least a portion of the first waveguiding layer.

In some embodiments, the first platform and the second platform face substantially the same direction.

Another of the broader forms of the present disclosure involves an electrically pumped photonic crystal surface emitting laser device. The laser device comprises a substrate having an inner surface and an outer surface; a first waveguiding layer on the inner surface of the substrate; an active layer having a quantum structure on the first waveguiding layer; a second waveguiding layer on the active layer; a contact layer on the second waveguiding layer, wherein the first waveguiding layer, the active layer, the second waveguiding layer, and the contact layer form an epitaxy structure, the epitaxy structure having a first platform and a second platform, the first platform having multiple holes to form a photonic crystal structure; a first insulating layer on an upper surface and a sidewall surface of the first platform, and on an upper surface of the second platform, wherein the sidewall surface of the first platform passes through the contact layer, the second waveguiding layer, and the active layer, and wherein the first insulating layer has a first aperture corresponding to the photonic crystal structure; a light-transmissive conducting layer on the first insulating layer and connecting to the photonic crystal structure through the first aperture of the first insulating layer; a first electrode on the light-transmissive conducting layer; a second insulating layer on the outer surface of the substrate, wherein the second insulating layer has a second aperture; and a second electrode connecting to the substrate through the second aperture of the second insulating layer, wherein the second electrode has an opening corresponding to the first aperture of the first insulating layer.

In some embodiments, the sidewall surface of the first platform further passes through at least a portion of the first waveguiding layer.

In some embodiments, the first platform and the second platform face substantially the same direction.

Still another of the broader forms of the present disclosure involves an electrically pumped photonic crystal surface emitting laser device. The laser device comprises a substrate having an inner surface and an outer surface; a first waveguiding layer on the inner surface of the substrate; an active layer having a quantum structure on the first waveguiding layer; a second waveguiding layer on the active layer; a contact layer on the second waveguiding layer, wherein the first waveguiding layer, the active layer, the second waveguiding layer, and the contact layer form an epitaxy structure, the epitaxy structure having a platform with multiple holes to form a photonic crystal structure; a first insulating layer on an upper surface and a sidewall surface of the platform, and on the inner surface of the substrate, wherein the first insulating layer has a first aperture corresponding to the photonic crystal structure, and a second aperture on the inner surface of the substrate; a light-transmissive conducting layer on the first insulating layer and connecting to the photonic crystal structure through the first aperture of the first insulating layer; a first electrode on the light-transmissive conducting layer; a second electrode connecting to the substrate through the second aperture of the first insulating layer; and a second insulating layer on the outer surface of the substrate.

In some embodiments, the first electrode and the second electrode face substantially the same direction.

In some embodiments, the laser device is an asymmetric structure with the first electrode at one side and the second electrode at the other side.

In some embodiments, the laser device is a symmetric structure with the second electrode surrounding the first electrode.

In some embodiments, the substrate further has a recess corresponding to the photonic crystal structure.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. The drawings are used for better understanding of the present invention, but not intended to limit the scope of the claimed invention.

FIG. 19 is a schematic cross-sectional view of an electrically pumped photonic crystal surface emitting laser device 300B according to an embodiment of the present disclosure.

FIG. 20 is a schematic bottom plan view of the laser device 300B according to an embodiment of the present disclosure.

FIG. 21 is a schematic diagram of a first waveguiding layer 320 according to an embodiment of the present disclosure.

FIG. 22 is a schematic diagram of a second waveguiding layer 340 according to an embodiment of the present disclosure.

FIG. 23 is a schematic cross-sectional view of an electrically pumped photonic crystal surface emitting laser device 400A according to an embodiment of the present disclosure.

FIG. 24 is a schematic diagram of a first waveguiding layer 420 according to an embodiment of the present disclosure.

FIG. 27 is a schematic top plan view of the laser device 400A according to an embodiment of the present disclosure.

FIG. 28 is a schematic cross-sectional view of an electrically pumped photonic crystal surface emitting laser device 500A according to an embodiment of the present disclosure.

FIG. 29 is a schematic diagram of a first waveguiding layer 520 according to an embodiment of the present disclosure.

FIG. 30 is a schematic diagram of a second waveguiding layer 540 according to an embodiment of the present disclosure.

FIG. 32 is a schematic top plan view of the laser device 500A according to an embodiment of the present disclosure.

FIG. 33 is a schematic cross-sectional view of an electrically pumped photonic crystal surface emitting laser device 600A according to an embodiment of the present disclosure.

FIG. 34 is a schematic diagram of a first waveguiding layer 620 according to an embodiment of the present disclosure.

FIG. 35 is a schematic diagram of a second waveguiding layer 640 according to an embodiment of the present disclosure.

FIG. 37 is a schematic bottom plan view of the laser device 600A according to an embodiment of the present disclosure.

FIG. 38 is a schematic cross-sectional view of an electrically pumped photonic crystal surface emitting laser device 700A according to an embodiment of the present disclosure.

FIG. 39 is a schematic diagram of a first waveguiding layer 720 according to an embodiment of the present disclosure.

FIG. 40 is a schematic diagram of a second waveguiding layer 740 according to an embodiment of the present disclosure.

DETAILED DESCRIPTION OF DISCLOSED EMBODIMENTS

Figure 1:
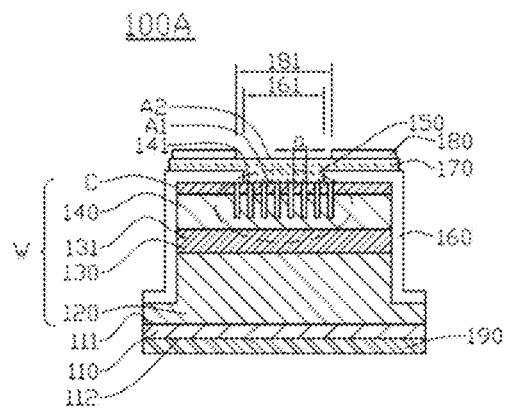
FIG. 1 is a schematic cross-sectional view of an electrically pumped photonic crystal surface emitting laser device 100A according to an embodiment of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper", "over", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

The exemplary embodiments of the present invention will be described in the following by taking in conjunction with drawings, wherein various details included in the embodiments for better understanding are merely exemplary. Therefore, a person having ordinary skills in the art should realize that various modifications and changes may be made to the embodiments described herein without departing from the scope and spirit of the invention. Also, for clarity and conciseness, descriptions of well-known functions and structures are omitted in the following description.

FIG. 1 is a schematic cross-sectional view of an electrically pumped photonic crystal surface emitting laser device 100A according to an embodiment of the present disclosure. FIGS. 1A-1L are schematic cross-sectional views for forming the laser device 100A shown in FIG. 1. FIG. 2 is a schematic flowchart of a method 100 for forming the laser device 100A shown in FIG. 1 according to an embodiment of the present disclosure.

Referring to FIG. 1, the laser device 100A includes a substrate 110, a first waveguiding layer 120, an active layer 130, a second waveguiding layer 140, a contact layer C, a photonic crystal structure 150, an insulating layer 160, a light-transmissive conducting layer 170, a first electrode 180, and a second electrode 190. In the embodiment, the first waveguiding layer 120 may include at least a N-type semiconductor layer, and the second waveguiding layer 140 may include at least a P-type semiconductor layer, but the invention is not limited thereto.

In the embodiment, the substrate 110 may be a N-type semiconductor substrate layer, and the substrate 110 has an inner surface 111 and an outer surface 112. The first waveguiding layer 120 is over the inner surface 111 of the substrate 110. The active layer 130 is over the first waveguiding layer 120 and has a quantum structure 131. The second waveguiding layer 140 is over the active layer 130 and has a thickness between 10 to 3000 nm, but the invention is not limited thereto. In another embodiment, the second waveguiding layer 140 may further comprises a distributed Bragg reflector (DBR) structure therein, and the thickness of the second waveguiding layer 140 may be greater than 3000 nm. The contact layer C is over the second waveguiding layer 140.

Figure 1A:
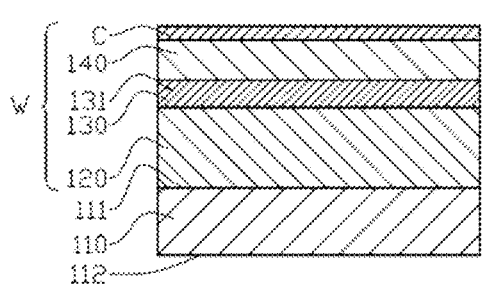
FIGS. 1A-1L are schematic cross-sectional views for forming the laser device 100A shown in FIG. 1.
Figure 1B:
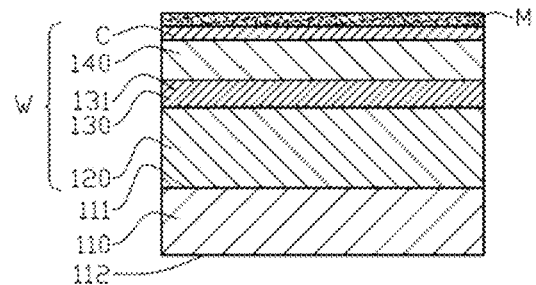
Figure 1C:
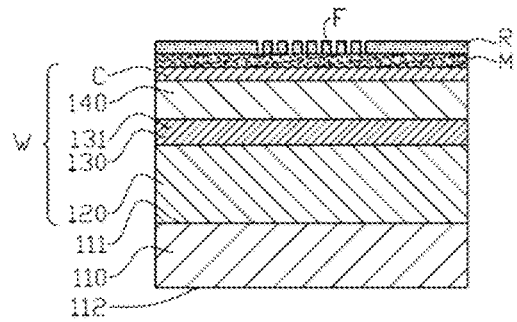
Figure 1D:
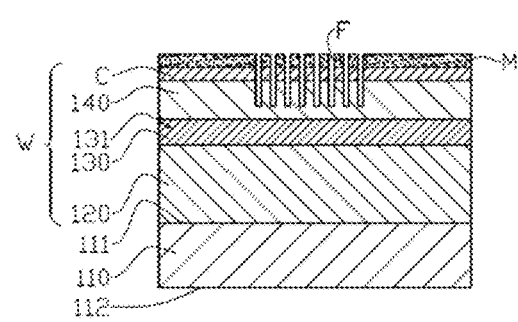
Figure 1E:
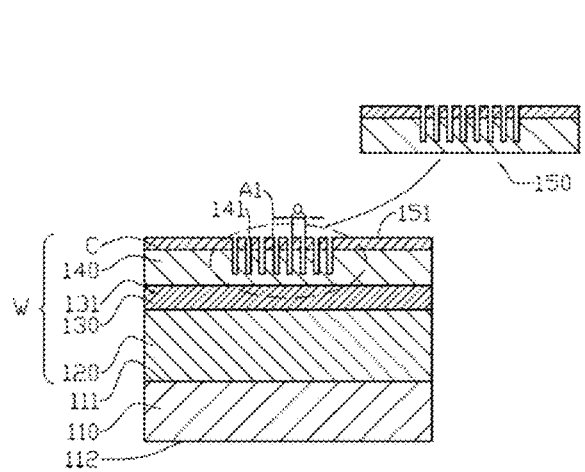
Figure 1F:
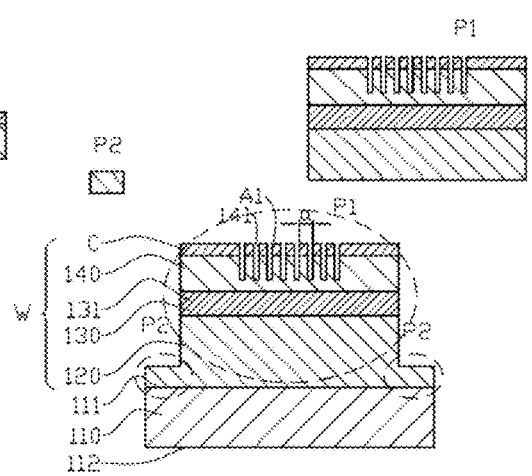
Figure 2:
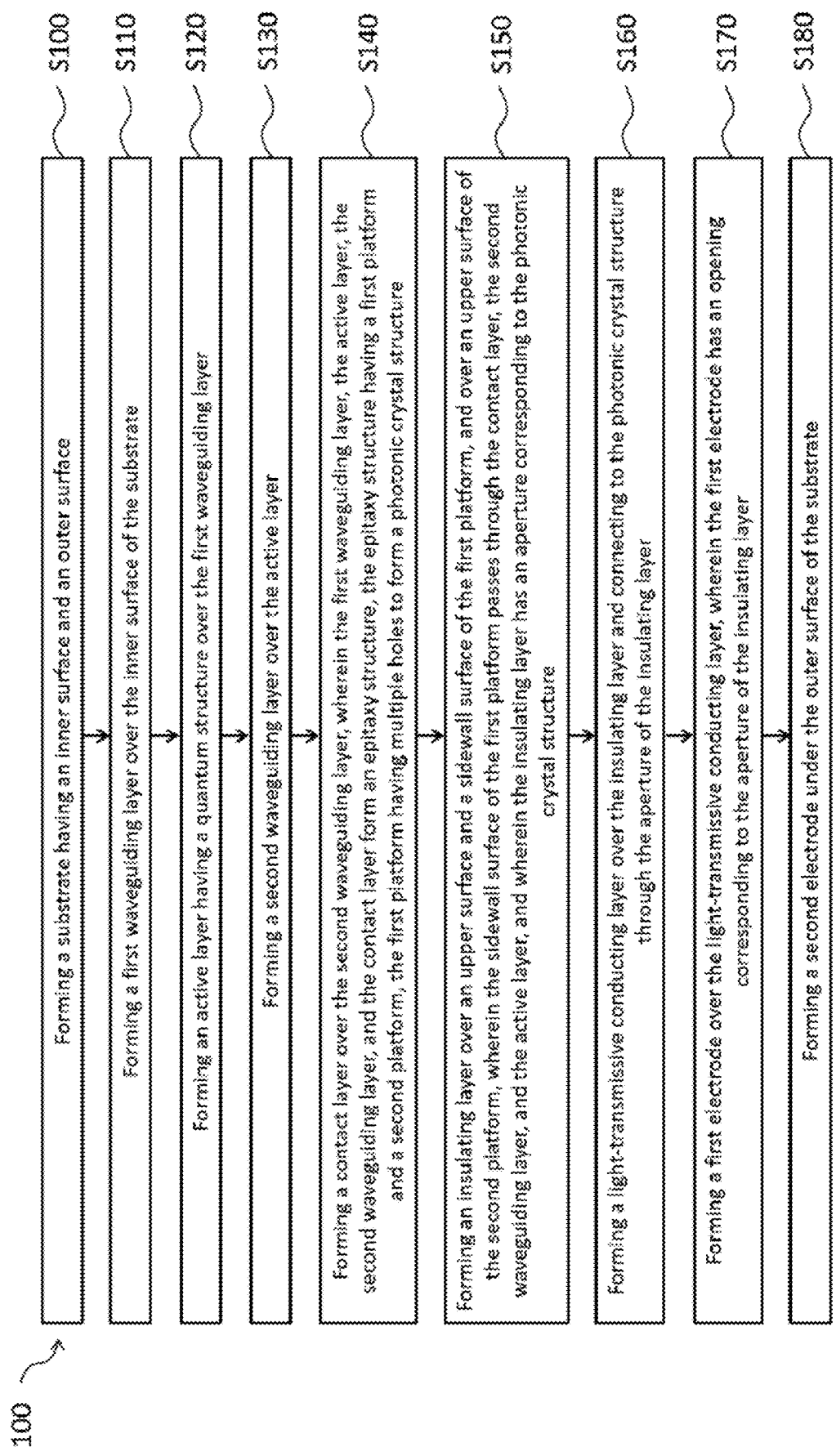
FIG. 2 is a schematic flowchart of a method 100 for forming the laser device 100A shown in FIG. 1 according to an embodiment of the present disclosure.
Figure 3A:
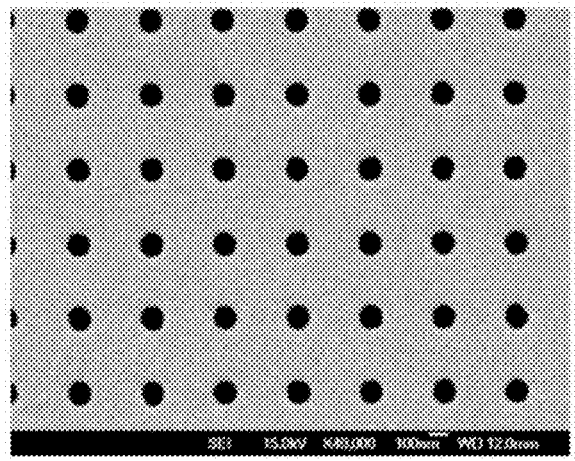
FIGS. 3A-3E are images of photonic crystal structures respectively measured by an electron microscope.
Figure 3B:
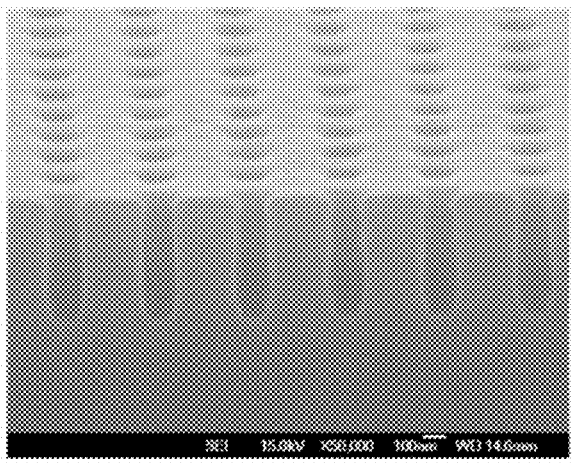
Figure 3C:
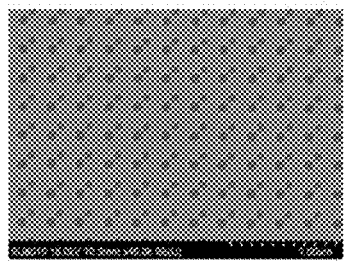
Figure 3D:
Figure 3E:
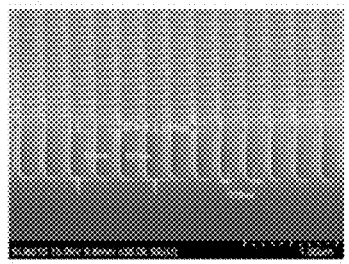

Referring to FIGS. 1A-1F and FIG. 2. As depicted in step S100, the method 100 begins at step S100 by forming a substrate 110 having an inner surface 111 and an outer surface 112. As depicted in step S110, the method 100 continues with step S110 by forming a first waveguiding layer 120 over the inner surface 111 of the substrate 110. As depicted in step S120, the method 100 continues with step S120 by forming an active layer 130 having a quantum structure 131 over the first waveguiding layer 120. As depicted in step S130, the method 100 continues with step S130 by forming a second waveguiding layer 140 over the active layer 130. As depicted in step S140, the method 100 continues with step S140 by forming a contact layer C over the second waveguiding layer 140, wherein the first waveguiding layer 120, the active layer 130, the second waveguiding layer 140, and the contact layer C form an epitaxy structure W, the epitaxy structure W having a first platform P1 and a second platform P2, the first platform P1 having multiple holes 141 to form a photonic crystal structure 150. Referring to FIG. 1A, the first waveguiding layer 120, the active layer 130, the second waveguiding layer 140, and the contact layer C fabricate an epitaxy structure W, but the number of layers of the epitaxy structure W is not limited. Further referring to FIG. 1B, a hard mask M is fabricated by having silicon nitride ($SiN_x$) deposited on the epitaxy structure W, but the invention is not limited thereto. Referring to FIG. 1C, a photonic crystal pattern F is formed by having positive photoresist R applied on the epitaxy structure W within a square area of 290 μm, but the invention is not limited thereto. FIG. 1D illustrates the imprint of the photonic crystal pattern F. The photonic crystal pattern F is imprinted onto the hard mask M by dry etching, and then the positive photoresist R is removed; then the photonic crystal pattern F is further imprinted onto the epitaxy structure W by dry etching, too. Since a waveguide pattern of the quantum structure 131 mostly restricts the laser within the active layer 130, deep etching is required for the photonic crystal structure 150 to have a better coupling with the active layer 130. When the depth of etching is greater than 500 nm, the coupling efficiency of the photonic crystals is better, but the invention is not limited thereto. FIG. 1E further illustrates removal of the hard mask M. Referring to FIG. 1F and step S140, the first platform P1 and the second platform P2 are etched on the epitaxy structure W. The first platform P1 and the second platform P2 face substantially the same direction. The first platform P1 further includes a plurality of holes 141 to form the photonic crystal structure 150 with a plurality of first areas A1 on a top surface 151 of the photonic crystal structure 150. In the embodiment, the periodicity a of the photonic crystal structure 150 is 385, 388, 390, 393, or 395 nm. Additionally, the holes 141 of the first platform P1 as shown in FIGS. 3A-3B are arranged in a column shape with a depth of 520-540 nm and a diameter of 130-140 nm, and the holes 141 are arranged in 2-dimension, but the invention is not limited thereto. In another embodiment, the periodicity a of the photonic crystal structure 150 is 275 nm. Additionally, the holes 141 of the first platform P1 as shown in FIGS. 3C-3E are arranged in a column shape with a depth of 520-540 nm and a diameter of 80-100 nm, and the holes 141 are arranged in 2-dimension, but the invention is not limited thereto.

Figure 1G:
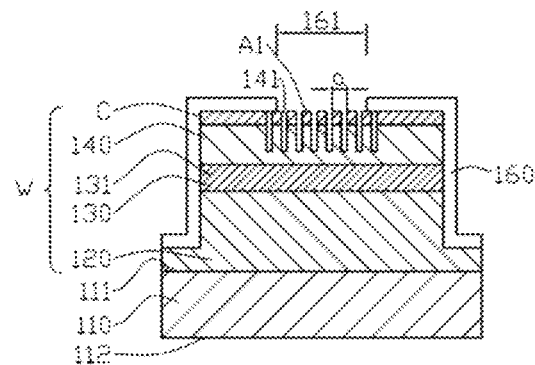

Still referring to FIG. 1G and FIG. 2. FIG. 1G illustrates the fabrication of the insulating layer 160. As depicted in step S150, the method 100 continues with step S150 by forming an insulating layer 160 over an upper surface and a sidewall surface of the first platform P1, and over an upper surface of the second platform P2, wherein the sidewall surface of the first platform P1 passes through the contact layer C, the second waveguiding layer 140, and the active layer 130, and wherein the insulating layer 160 has an aperture 161 corresponding to the photonic crystal structure 150. In some embodiments, the sidewall surface of the first platform P1 further passes through at least a portion of the first waveguiding layer 120. Therefore, the edges of contact layer C, the second waveguiding layer 140, the active layer 130, and the at least a portion of the first waveguiding layer 120 are protected by the insulating layer 160 from being exposed to the atmosphere. The insulating layer 160 can prevent the interior structure from being oxidized in order to gain good reliability.

Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. Consequently, SiN$_x$ is deposited with a thickness of 120 nm, and then photolithography is applied to fabricate a geometric pattern of an aperture 161 in the middle of the first areas A1 of the photonic crystal structure 150 with a diameter of 200 μm. After removing unnecessary SiN$_x$ by lift-off or dry etching process, the aperture 161 is fabricated correspondingly to the first areas A1 to confine electrical currents within the first areas A1.

Figure 1H:
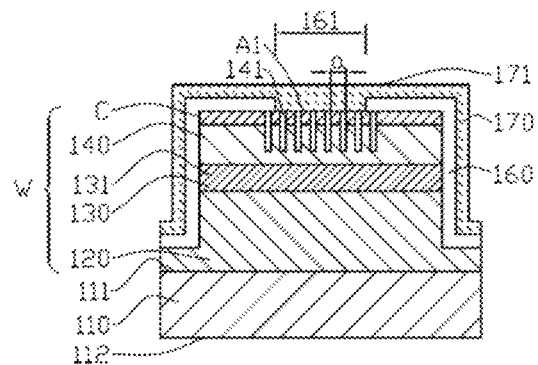
Figure 1I:
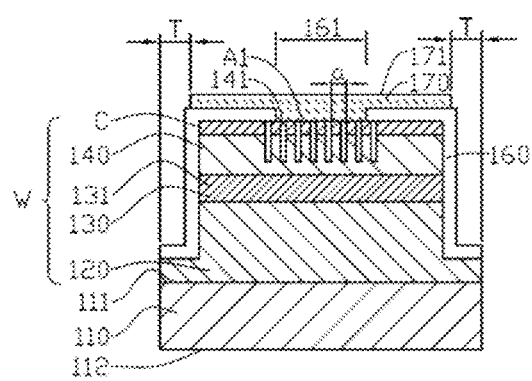

Still referring to FIGS. 1H-1I and FIG. 2. As depicted in step S160, the method 100 continues with step S160 by forming a light-transmissive conducting layer 170 over the insulating layer 160 and connecting to the photonic crystal structure 150 through the aperture 161 of the insulating layer 160. FIG. 1H illustrates the fabrication of the light-transmissive conducting layer 170. Since the embodiment discloses a surface-emitting laser, covering a great area of metal around the area for emission would affect the emission. Therefore, the light-transmissive conducting layer 170 is formed by having indium tin oxide (ITO) fabricated with a thickness of 225 nm by an evaporator or a sputter. The light-transmissive conducting layer 170 is over the insulating layer 160 and covering the first areas A1 of the photonic crystal structure 150 for laterally spreading electrical currents over the first areas A1. Further referring to FIG. 1I, after fabrication of the light-transmissive conducting layer 170, a trench T is fabricated by photolithography to form a boundary for isolation. Then the light-transmissive conducting layer 170 in the trench T is removed by etching. However, the invention is not limited thereto.

Figure 1J:
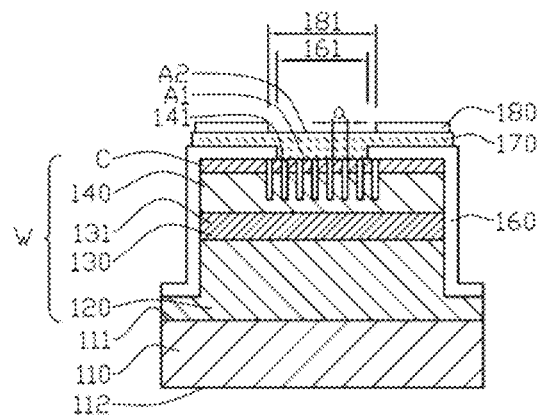
Figure 1K:
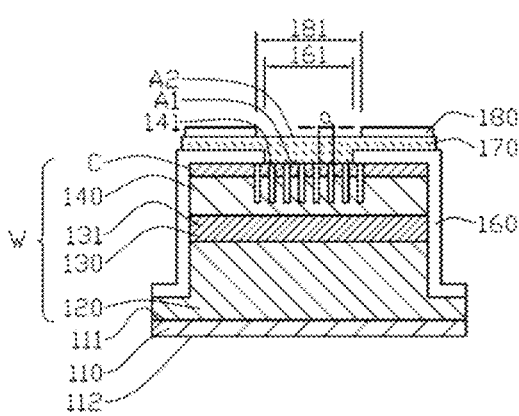

Still referring to FIGS. 1J-1K and FIG. 2. As depicted in step S170, the method 100 continues with step S170 by forming a first electrode 180 over the light-transmissive conducting layer 170, wherein the first electrode 180 has an opening 181 corresponding to the aperture 161 of the insulating layer 160. FIG. 1J illustrates the deposition of the first electrode 180. An electrode pattern is fabricated by photolithography, and then titanium (Ti), platinum (Pt), and gold (Au) are deposited and removed by lift-off process to form the first electrode 180 on the light-transmissive conducting layer 170 with an opening 181. A second area A2 is over a top surface 171 of the light-transmissive conducting layer 170, thereby the second area A2 is corresponding to the first areas A1. The opening 181 of the first electrode 180 is corresponding to the second area A2 of the light-transmissive conducting layer 170 to avoid blocking the first areas A1 of the photonic crystal structure 150, but the invention is not limited thereto. In an embodiment, the first electrode 180 may extend to cover a side surface of the light-transmissive conducting layer 170 for increasing a contact area between the first electrode 180 and the light-transmissive conducting layer 170; in addition, the first electrode 180 may extend to contact the insulating layer 160. FIG. 1K illustrates the thickness of the substrate 110 is reduced for the outer surface 112 thereof to be a mirror-like surface. In addition, the whole thickness of the thinned substrate 110 may be substantially the same, but the invention is not limited thereto.

Figure 1L:
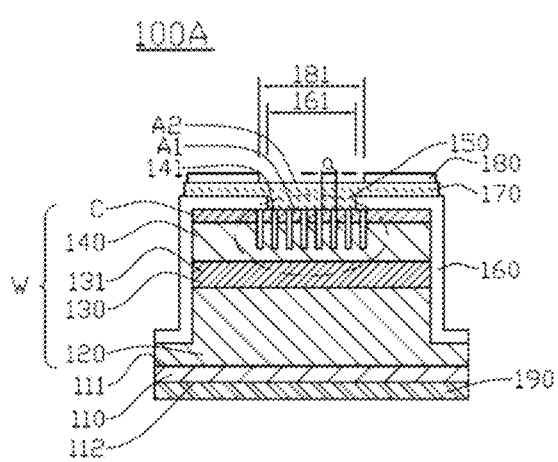

Still referring to FIG. 1L and FIG. 2. As depicted in step S180, the method 100 continues with step S180 by forming a second electrode 190 under the outer surface 112 of the substrate 110. FIG. 1L illustrates the deposition of nickel (Ni), germanium (Ge), and gold (Au) to fabricate the second electrode 190 on the outer surface 112 of the substrate 110. Then the electrically pumped photonic crystal surface emitting laser device 100A is fabricated after rapid thermal annealing process. Still, the invention is not limited thereto.

Figure 4:
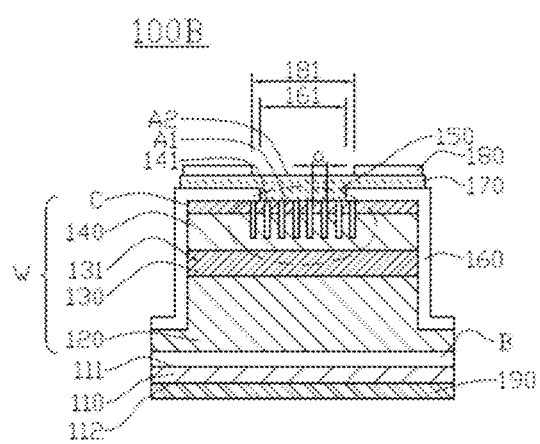
FIG. 4 is a schematic cross-sectional view of an electrically pumped photonic crystal surface emitting laser device 100B according to an embodiment of the present disclosure.

FIG. 4 illustrates an electrically pumped photonic crystal surface emitting laser device 100B according to an embodiment. In addition to the structure disclosed above, the laser device 100B further includes a buffer layer B between the substrate 110 and the first waveguiding layer 120. In the embodiment, the buffer layer B comprises a material selected from a group of gallium nitride (GaN), gallium arsenide (GaAs) and indium phosphide (InP), and has a thickness of 200 nm.

Figure 5A:
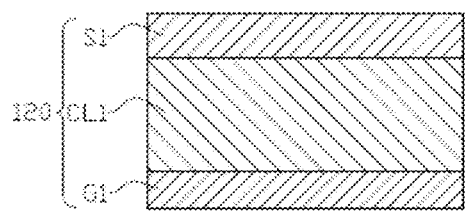
FIG. 5A is a schematic diagram of a first waveguiding layer 120 according to an embodiment of the present disclosure.

FIG. 5A is a schematic diagram of a first waveguiding layer 120 according to an embodiment. The first waveguiding layer 120 comprises a first graded-index layer G1, a first cladding layer CL1, and a first separate confinement heterostructure S1. As depicted in FIG. 4 and FIG. 5A, the first graded-index layer G1 is arranged between the buffer layer B and the first cladding layer CL1. In the embodiment, the first cladding layer CL1 comprises a material of aluminum gallium arsenide (AlGaAs) and the composition of the chemical formula is $Al_{0.4}Ga_{0.6}As$. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 130.

Figure 5B:
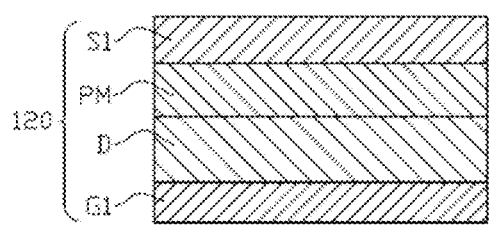
FIG. 5B is a schematic diagram of a first waveguiding layer 120 according to an embodiment of the present disclosure.

FIG. 5B is a schematic diagram of a first waveguiding layer 120 according to an embodiment. The first waveguiding layer 120 comprises a first graded-index layer G1, a distributed Bragg reflector (DBR) structure D, a phase matching layer PM, and a first separate confinement heterostructure S1. The DBR structure D is a reflector formed from multiple layers of alternating materials with varying refractive index resulting in periodic variation in the effective refractive index. An optical thickness of each of the multiple layers may be equal to or close to one quarter of a wavelength, the many reflections from each interface of the multiple layers combine with constructive interference, and the multiple layers act as a high-quality and highly-reflection reflector. The range of wavelengths that are highly reflected is called the photonic stopband. Within this range of wavelengths, light is "forbidden" to propagate in the structure.

Figure 6:
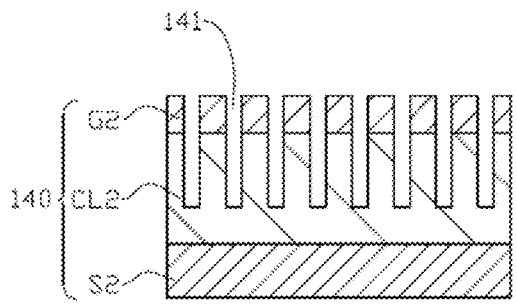
FIG. 6 is a schematic diagram of a second waveguiding layer 140 according to an embodiment of the present disclosure.

FIG. 6 is a schematic diagram of a second waveguiding layer 140 according to an embodiment. The second waveguiding layer 140 comprises a second graded-index layer G2, a second cladding layer CL2, and a second separate confinement heterostructure S2. As depicted in FIGS. 4-6, the second separate confinement heterostructure S2 is arranged between the active layer 130 and the second cladding layer CL2. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the second cladding layer CL2 and the contact layer C. The second cladding layer CL2, the second graded-index layer G2, and the contact layer C are fabricated with a plurality of holes 141 therein to form the photonic crystal structure 150. In the embodiment, the second cladding layer CL2 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the second cladding layer CL2 is 200 nm and a thickness of the second graded-index layer G2 is 150 nm. However, the invention is not limited thereto.

Still referring to FIGS. 4-6, the epitaxy structure W is therefore fabricated by the first graded-index layer G1, the first cladding layer CL1, the first separate confinement heterostructure S1, the active layer 130, the second separate confinement heterostructure S2, the second cladding layer CL2, the second graded-index layer G2, and the contact layer C, but the number of layers of the epitaxy structure W is not limited. For example, in some embodiments, the epitaxy structure W may further include the substrate 110 and the buffer layer B. As depicted in FIG. 4, FIG. 5B, and FIG. 6, the epitaxy structure W is fabricated by the first graded-index layer G1, the DBR structure D, the phase matching layer PM, the first separate confinement heterostructure S1, the active layer 130, the second separate confinement heterostructure S2, the second cladding layer CL2, the second graded-index layer G2, and the contact layer C, but the number of layers of the epitaxy structure W is not limited. Moreover, the second waveguiding layer 140 is a p-type semiconductor with beryllium (Be) dopant, zinc (Zn) dopant, or carbon (C) dopant at an amount of $10^{18}$ cm$^{-3}$, and the contact layer C is heavily doped at an amount of $10^{19}$ cm$^{-3}$ for better ohmic contact with the light-transmissive conducting layer 170. The first waveguiding layer 120 is an n-type semiconductor with silicon (Si) dopant at an amount of $10^{18}$ cm$^{-3}$. The materials fabricating the substrate 110, the buffer layer B, the first graded-index layer G1, the first cladding layer CL1, the DBR structure D, the phase matching layer PM, the first separate confinement heterostructure S1, the second separate confinement heterostructure S2, the second cladding layer CL2, the second graded-index layer G2, and the contact layer C also allow a wavelength of the laser to include blue and infrared lights.

Figure 7A:
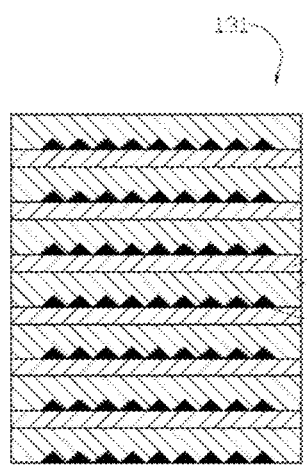
FIGS. 7A-7C are schematic diagrams of quantum structures according to embodiments of the present disclosure.

Further referring to FIG. 7A, the quantum structure 131 includes at least a layer of quantum dots 131A. In the embodiment, the quantum structure 131 has seven layers of quantum dots 131A, each layer having a quantum dot 1311, a cap layer 1312, and a space layer 1313. The quantum dot 1311 is covered by the cap layer 1312, and the cap layer 1312 is covered by the space layer 1313. The quantum dot 1311 comprises a material of 2.2-monolayer indium arsenide (InAs). The cap layer 1312 comprises a material of indium gallium arsenide (InGaAs) with a thickness of 5 nm, and the composition of the chemical formula is In0.15Ga0.85As. The space layer 1313 comprises a material of GaAs with a thickness of 45 nm. However, the invention is not limited thereto.

Figure 7B:
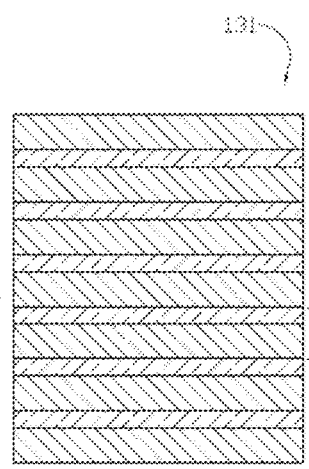
Figure 7C:
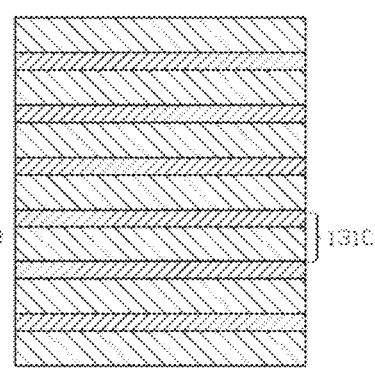

Referring to FIG. 7B and FIG. 7C, the quantum structure 131 includes at least a layer of quantum wire 131B or quantum well 131C. In an embodiment, the periodicity a of the photonic crystal structure 150 may be 385 nm, 388 nm, 390 nm, 393 nm or 395 nm, and a wavelength of emitted laser beam may be around 1.3 μm. In another embodiment, the periodicity a of the photonic crystal structure 150 is 275 nm, and a wavelength of emitted laser beam is around 940 nm. In other words, the wavelength of emitted laser beam is variable since the wavelength becomes longer as the periodicity a of the photonic crystal structure 150 gets longer. On the other hand, the disclosed embodiments do not require complex techniques of wafer fusion bonding and epitaxial regrowth for fabrication; instead, it has the epitaxy structure W etched from the top for fabrication of the photonic crystal structure 150 and has the light-transmissive conducting layer 170 thereon, so as to enable laser beams to be emitted from a front surface of the epitaxy structure W and to bring features of surface-emission and narrow divergence angle.

Figure 8:
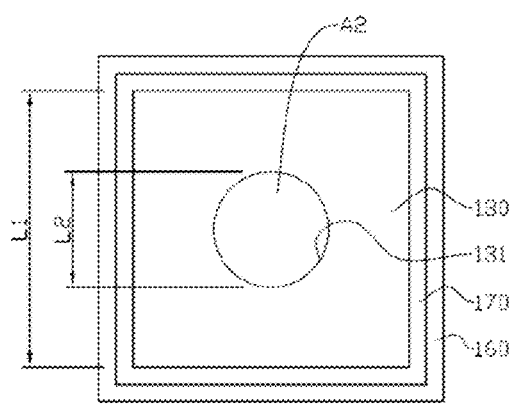
FIG. 8 is a schematic top plan view of an electrically pumped photonic crystal surface emitting laser device 100A or 100B according to an embodiment of the present disclosure.
Figure 9:
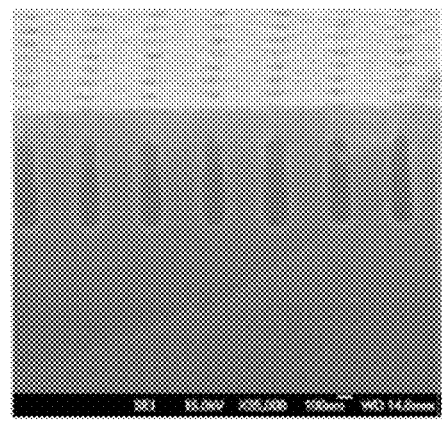
FIG. 9 is a cross-sectional image of a photonic crystal structure 150 measured by an electron microscope.

With the features disclosed above, in each of the embodiments, the first electrode 180, the light-transmissive conducting layer 170, the insulating layer 160, and the second electrode 190 are electrically pumped to activate the quantum structure 131 of the active layer 130 to generate laser beams. In each of the embodiments, the cavity for laser oscillation is formed horizontally by photonic crystal structure, while the laser beam is emitting vertically. In one direction, the laser beams are vertically surface-emitted to the first areas A1 of the photonic crystal structure 150, the aperture 161 of the insulating layer 160, the second area A2 of the light-transmissive conducting layer 170, to the opening 181 of the first electrode 180. In the opposite direction, when the first waveguiding layer 120 does not include the DBR structure D, the laser beams are surface-emitted to the substrate 110 but scattered instead. When the first waveguiding layer 120 includes the DBR structure D, the laser beams are surface-emitted to the first waveguiding layer 120; then the DBR structure D reflects the laser beams to the first areas A1 of the photonic crystal structure 150, the aperture 161 of the insulating layer 160, the second area A2 of the light-transmissive conducting layer 170, to the opening 181 of the first electrode 180 on the electrically pumped photonic crystal surface emitting laser device 100A or 100B. As shown in FIG. 8, an outer side length L1 and inner side length L2 of the first electrode 180 are respectively 650 μm and 300 and the opening 181 exposes the second area A2 of the light-transmissive conducting layer 170 therein. Also, the fabrication of the insulating layer 160 and the light-transmissive conducting layer 170 as shown in FIG. 9 can be compared with FIGS. 3A and 3B in which they are not fabricated yet to further illustrate the position of the insulating layer 160 and the light-transmissive conducting layer 170 on the electrically pumped photonic crystal surface emitting laser device 100A or 100B.

Figure 10:
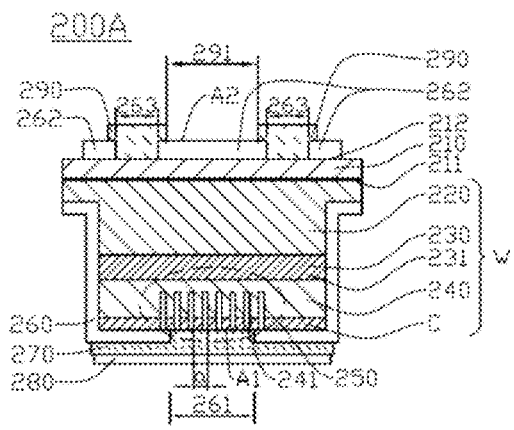
FIG. 10 is a schematic cross-sectional view of an electrically pumped photonic crystal surface emitting laser device 200A according to an embodiment of the present disclosure.
Figure 10A:
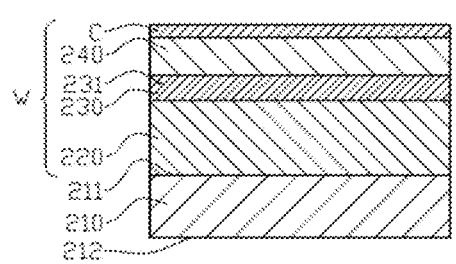
FIGS. 10A-10O are schematic cross-sectional views for forming the laser device 200A shown in FIG. 10.
Figure 10B:
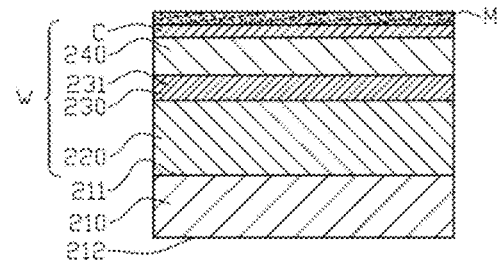
Figure 10O:
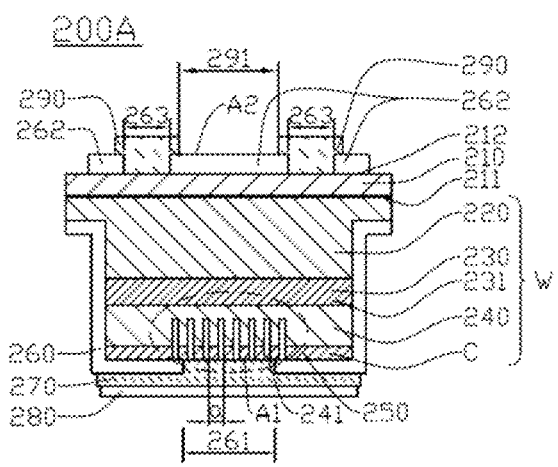
Figure 11:
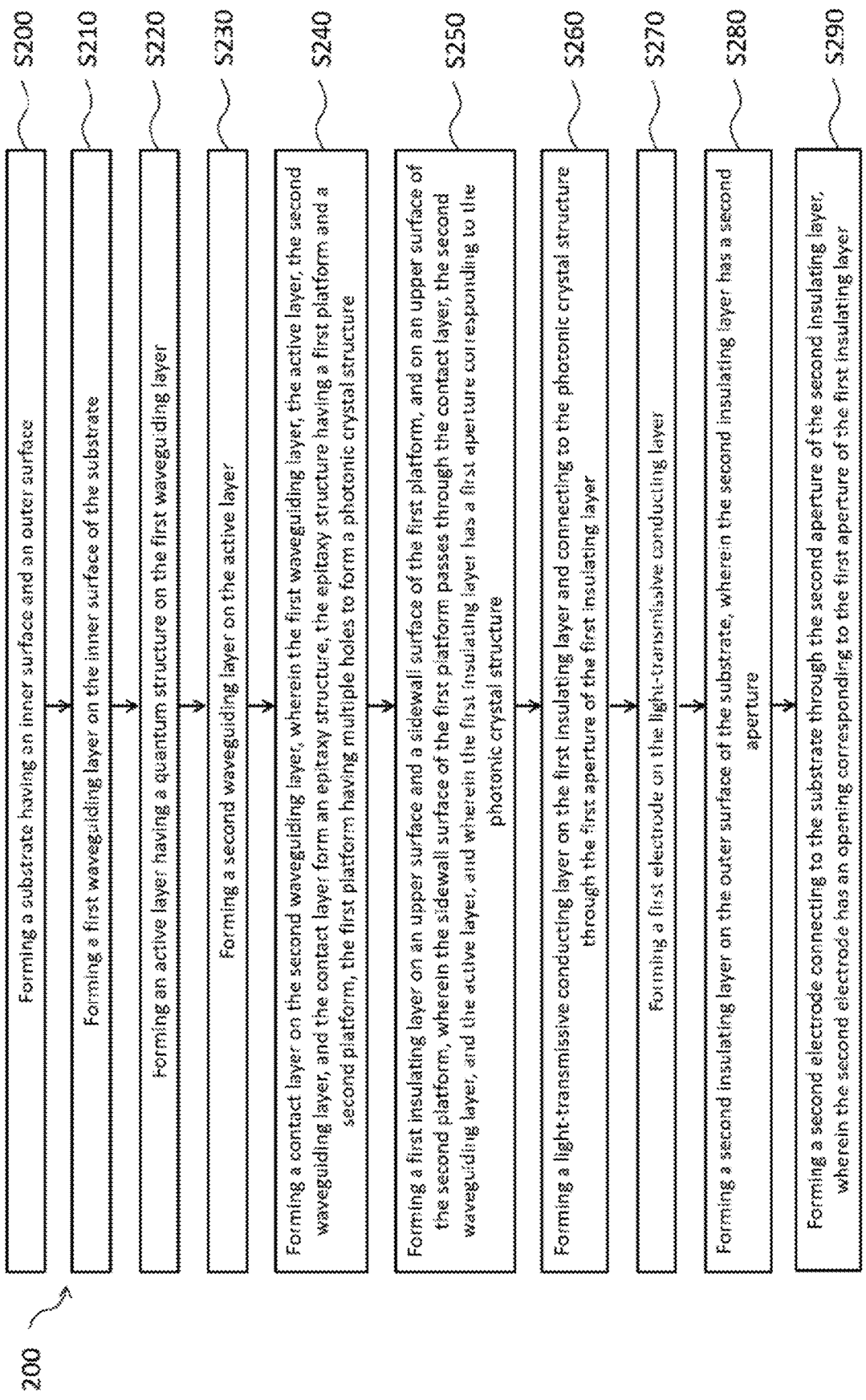
FIG. 11 is a schematic flowchart of a method 200 for forming the laser device 200A shown in FIG. 10 according to an embodiment of the present disclosure.

FIG. 10 is a schematic cross-sectional view of an electrically pumped photonic crystal surface emitting laser device 200A according to an embodiment of the present disclosure. FIGS. 10A-10O are schematic cross-sectional views for forming the laser device 200A shown in FIG. 10. FIG. 11 is a schematic flowchart of a method 200 for forming the laser device 200A shown in FIG. 10 according to an embodiment of the present disclosure.

Referring to FIG. 10, the laser device 200A includes a substrate 210, a first waveguiding layer 220, an active layer 230, a second waveguiding layer 240, a contact layer C, a photonic crystal structure 250, a first insulating layer 260, a second insulating layer 262, a light-transmissive conducting layer 270, a first electrode 280, and a second electrode 290. In the embodiment, the first waveguiding layer 220 may include at least a N-type semiconductor layer, and the second waveguiding layer 240 may include at least a P-type semiconductor layer, but the invention is not limited thereto.

In the embodiment, the substrate 210 may be a N-type semiconductor substrate layer and has an inner surface 211 and an outer surface 212. The first waveguiding layer 220 is on the inner surface 211 of the substrate 210. The active layer 230 is on the first waveguiding layer 220 and has a quantum structure 231. The quantum structure 231 includes at least a layer of quantum dots, a layer of quantum wire, or a layer of quantum well. The second waveguiding layer 240 is on the active layer 230. The contact layer C is on the second waveguiding layer 240.

Figure 10C:
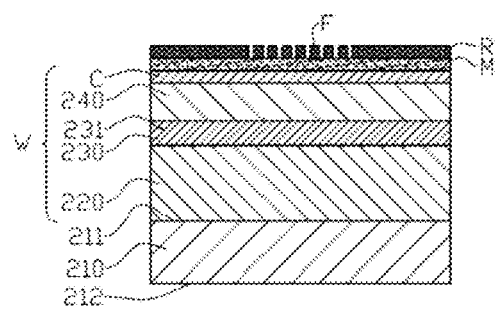
Figure 10D:
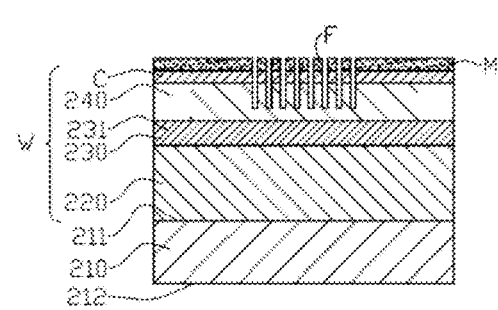
Figure 10E:
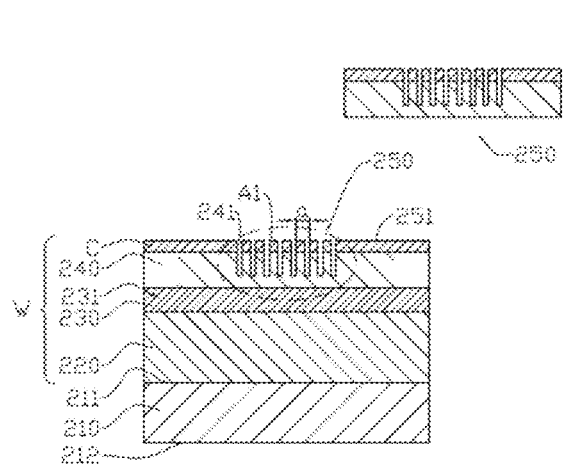
Figure 10F:
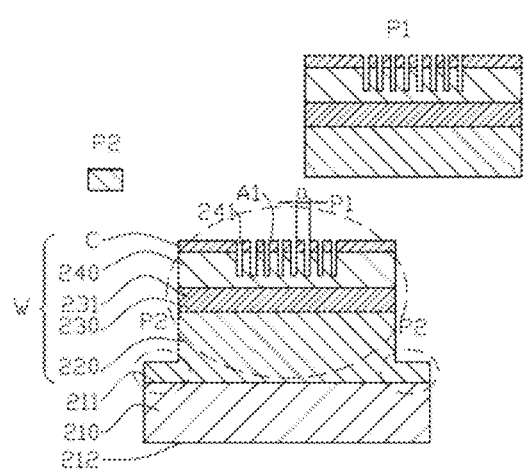

Referring to FIGS. 10A-10F and FIG. 11. As depicted in step S200, the method 200 begins at step S200 by forming a substrate 210 having an inner surface 211 and an outer surface 212. As depicted in step S210, the method 200 continues with step S210 by forming a first waveguiding layer 220 on the inner surface 211 of the substrate 210. As depicted in step S220, the method 200 continues with step S220 by forming an active layer 230 having a quantum structure 231 on the first waveguiding layer 220. As depicted in step S230, the method 200 continues with step S230 by forming a second waveguiding layer 240 on the active layer 230. As depicted in step S240, the method 200 continues with step S240 by forming a contact layer C on the second waveguiding layer 240, wherein the first waveguiding layer 220, the active layer 230, the second waveguiding layer 240, and the contact layer C form an epitaxy structure W, the epitaxy structure W having a first platform P1 and a second platform P2, the first platform P1 having multiple holes 241 to form a photonic crystal structure 250. Referring to FIG. 10A, the first waveguiding layer 220, the active layer 230, the second waveguiding layer 240, and the contact layer C fabricate an epitaxy structure W, but the number of layers of the epitaxy structure W is not limited. Further Referring to FIG. 10B, a hard mask M is fabricated by having silicon nitride ($SiN_x$) deposited on the epitaxy structure W, but the invention is not limited thereto. Referring to FIG. 10C, a photonic crystal pattern F is formed by having positive photoresist R applied on the epitaxy structure W within a square area of 290 μm, but the invention is not limited thereto. FIG. 10D illustrates the imprint of the photonic crystal pattern F. The photonic crystal pattern F is imprinted onto the hard mask M by dry etching, and then the positive photoresist R is removed; then the photonic crystal pattern F is further imprinted onto the epitaxy structure W by dry etching, too. Since a waveguide pattern of the quantum structure 231 mostly restricts the laser within the active layer 230, deep etching is required for the photonic crystal structure 250 to have a better coupling with the active layer 230. When the depth of etching is greater than 500 nm, the coupling efficiency of the photonic crystals is better, but the invention is not limited thereto. FIG. 10E further illustrates removal of the hard mask M. The epitaxy structure W are etched to form the first platform P1 and the second platform P2. The first platform P1 and the second platform P2 face substantially the same direction. The first platform P1 further includes a plurality of holes 241 to form the photonic crystal structure 250 with a plurality of first areas A1 on a top surface 251 of the photonic crystal structure 250. In the embodiment, the periodicity a of the photonic crystal structure 250 is 385, 388, 390, 393, or 395 nm. Additionally, the holes 241 of the first platform P1 are arranged in a column shape with a depth of 520-540 nm and a diameter of 130-140 nm, and the holes 141 are arranged in 2-dimension, but the invention is not limited thereto. In another embodiment, the periodicity a of the photonic crystal structure 250 is 275 nm. Additionally, the holes 241 of the first platform P1 are arranged in a column shape with a depth of 520-540 nm and a diameter of 80-100 nm, and the holes 241 are arranged in 2-dimension, but the invention is not limited thereto.

Figure 10G:
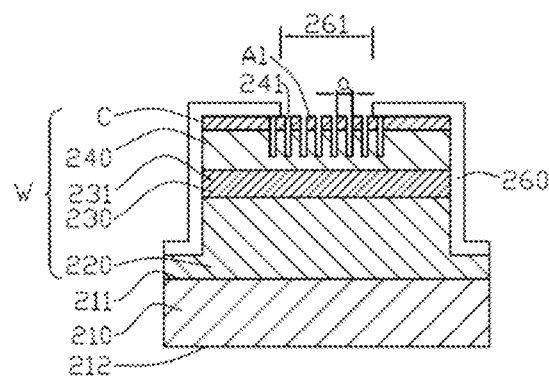

Still referring to FIG. 10G and FIG. 11. As depicted in step S250, the method 200 continues with step S250 by forming a first insulating layer 260 on an upper surface and a sidewall surface of the first platform P1, and on an upper surface of the second platform P2, wherein the sidewall surface of the first platform Pb passes through the contact layer C, the second waveguiding layer 240, and the active layer 230, and wherein the first insulating layer 260 has a first aperture 261 corresponding to the photonic crystal structure 250. In some embodiments, the sidewall surface of the first platform P1 further passes through at least a portion of the first waveguiding layer 220. Therefore, the edges of contact layer C, the second waveguiding layer 240, the active layer 230, and the at least a portion of the first waveguiding layer 220 are protected by the first insulating layer 260 from being exposed to the atmosphere. The first insulating layer 260 can prevent the interior structure from being oxidized in order to gain good reliability.

Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. Consequently, $SiN_x$ is deposited with a thickness of 120 nm, and then photolithography is applied to the present invention to fabricate a geometric pattern of a first aperture 361 in the middle of the first areas A1 of the photonic crystal structure 350 with a diameter of 150 μm. After removing unnecessary $SiN_x$ by lift-off or dry etching process, the first aperture 261 is fabricated correspondingly to the first areas A1 to confine electrical currents within the first areas A1.

Figure 10H:
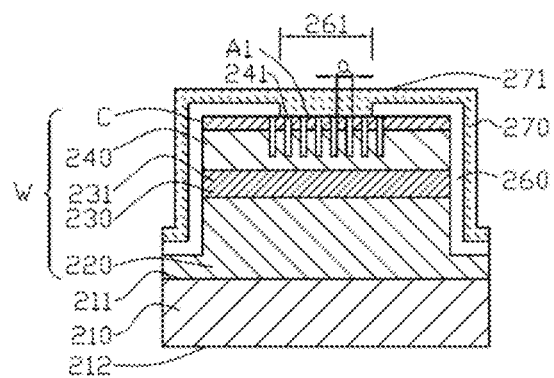

Still referring to FIG. 10H and FIG. 11. As depicted in step S260, the method 200 continues with step S260 by forming a light-transmissive conducting layer 270 on the first insulating layer 260 and connecting to the photonic crystal structure 250 through the first aperture 261 of the first insulating layer 260. The light-transmissive conducting layer 270 is formed by having ITO with a thickness of 225 nm. The light-transmissive conducting layer 270 is on the first insulating layer 260 and covering the first areas A1 of the photonic crystal structure 250.

Figure 10I:
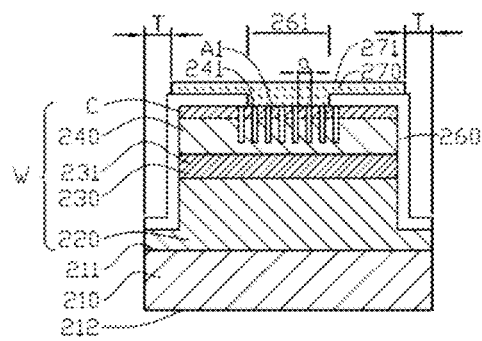

Further referring to FIG. 10I, after fabrication of the light-transmissive conducting layer 270, a trench T is fabricated by photolithography to form a boundary for isolation. Then the light-transmissive conducting layer 270 in the trench T is removed by etching. However, the invention is not limited thereto.

Figure 10J:
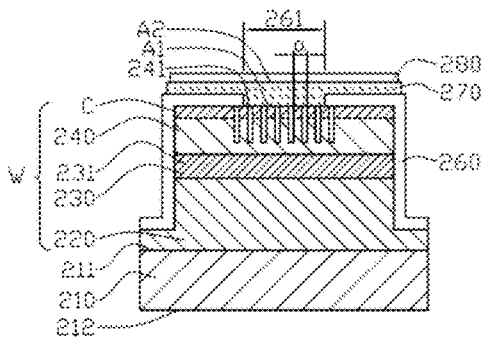

Still referring to FIG. 10J and FIG. 11. As depicted in step S270, the method 200 continues with step S270 by forming a first electrode 280 on the light-transmissive conducting layer 270. An electrode pattern is fabricated by photolithography, and then titanium (Ti), platinum (Pt), and gold (Au) are deposited and removed by lift-off process to form the first electrode 280 on the light-transmissive conducting layer 270, but the invention is not limited thereto.

Figure 10K:
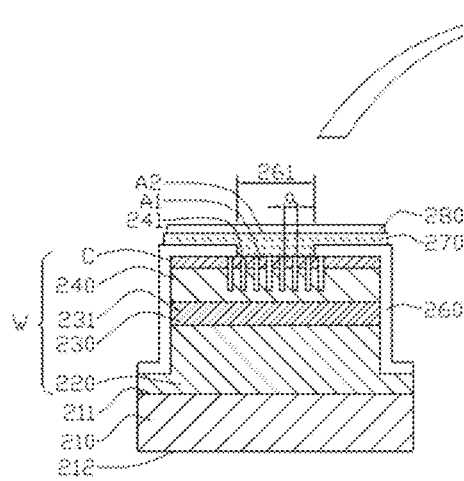
Figure 10K:
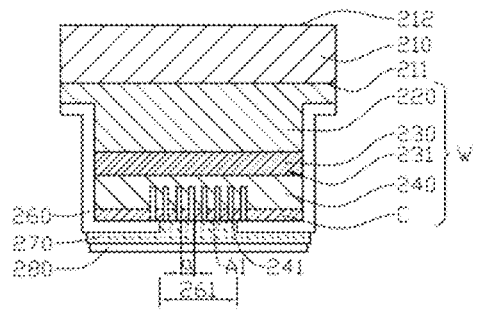
Figure 10L:
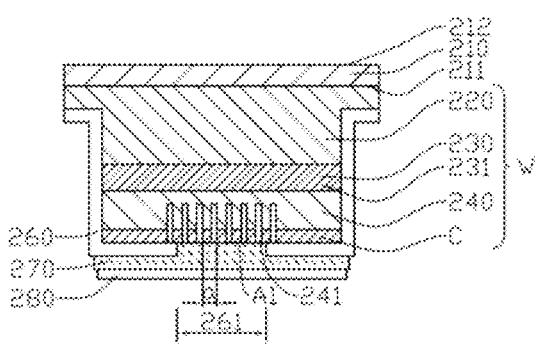

Still referring to FIGS. 10K-10L and FIG. 11. The epitaxy structure W and the substrate 210 are inversely disposed, and the thickness of the substrate 210 is reduced for the outer surface 212 thereof to be a mirror-like surface, but the invention is not limited thereto.

Figure 10M:
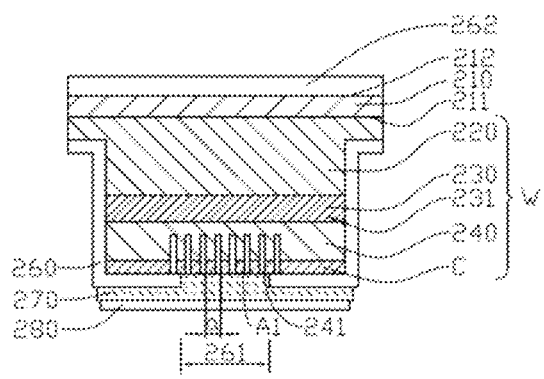
Figure 10N:
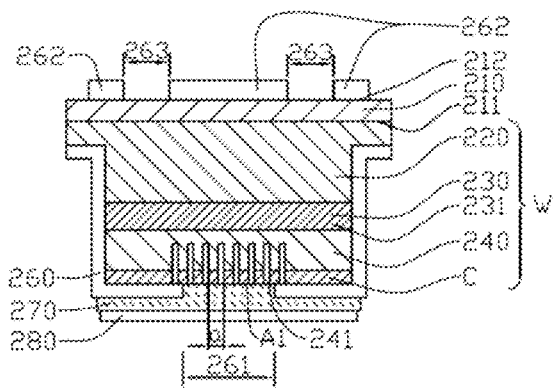

Still referring to FIGS. 10M-10N and FIG. 11. As depicted in step S280, the method 200 continues with step S280 by forming a second insulating layer 262 on the outer surface 212 of the substrate 210, wherein the second insulating layer 262 has a second aperture 263. The photolithography is applied to fabricate a geometric pattern of the second aperture 263 on the second insulating layer 262. After removing unnecessary $SiN_x$ by lift-off or dry etching process, the second aperture 263 is fabricated surrounding a middle portion of the second insulating layer 262.

Still referring to FIG. 10O and FIG. 11. As depicted in step S290, the method 200 continues with step S290 by forming a second electrode 290 connecting to the substrate 210 through the second aperture 263 of the second insulating layer 262, wherein the second electrode 290 has an opening 291 corresponding to the first aperture 261 of the first insulating layer 260. An electrode pattern is fabricated by photolithography, and then titanium (Ti), platinum (Pt), and gold (Au) are deposited and removed by lift-off process to form the second electrode 290 on the second insulating layer 262, the second electrode 290 connecting to the substrate 210 through the second aperture 263 of the second insulating layer 262. The second electrode 290 has an opening 291 corresponding to a second area A2 on a top surface of the second insulating layer 262 to avoid blocking the first areas A1 of the photonic crystal structure 250, so as to form the electrically pumped photonic crystal surface emitting laser device 200A. Then the electrically pumped photonic crystal surface emitting laser device 200A is fabricated after rapid thermal annealing process. Still, the invention is not limited thereto.

In another embodiment, the substrate 210 may be partially thinned at a region to form a treated substrate 210 having different thicknesses at different regions. For example, a first region of the treated substrate 210 directly below the photonic crystal structure 250 may be thinner than a second region of the treated substrate 210, and the first region may be surrounded by the second region to form a recess. The recess is corresponding to the photonic crystal structure 250. The second insulating layer 262 may be disposed on an inner surface of the recess, and has an opening to expose a portion of the inner surface of the recess for a second light-transmissive conducting layer to contact the first region of the substrate 210. The second light-transmissive conducting layer may extend to contact the second electrode 290, and an edge of the second light-transmissive conducting layer may be covered by the second electrode 290. In such embodiment, the light absorption rised by the substrate will decrease within the thinned first region of the treated substrate 210, and the strength of the epitaxy structure W can still be maintained because of the thicker second region of the treated substrate 210, but the invention is not limited thereto.

Figure 12:
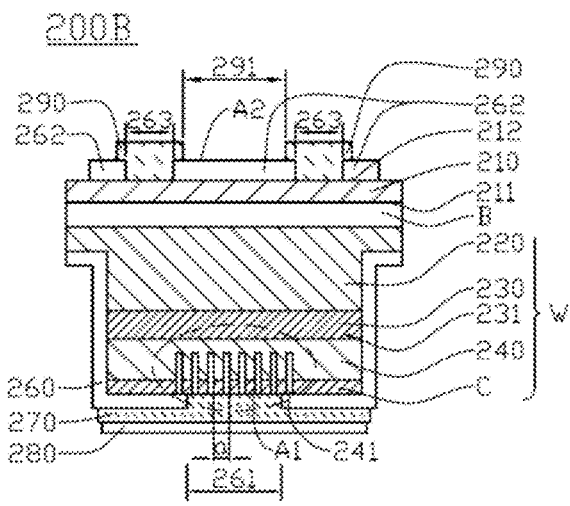
FIG. 12 is a schematic cross-sectional view of an electrically pumped photonic crystal surface emitting laser device 200B according to an embodiment of the present disclosure.
Figure 13:
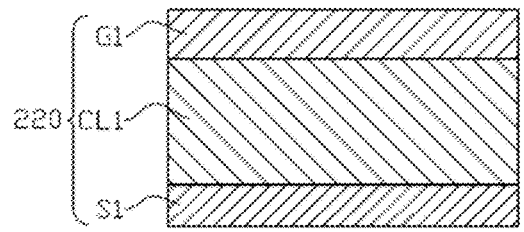
FIG. 13 is a schematic diagram of a first waveguiding layer 220 according to an embodiment of the present disclosure.

FIG. 12 illustrates an electrically pumped photonic crystal surface emitting laser device 200B in another embodiment. In addition to the structure disclosed above, the electrically pumped photonic crystal surface emitting laser device 200B further includes a buffer layer B between the substrate 210 and the first waveguiding layer 220. In the embodiment, the buffer layer B comprises a material selected from a group of GaN, GaAs and InP, and has a thickness of 200 nm. The first waveguiding layer 220 comprises a first graded-index layer G1, a first cladding layer CL1, and a first separate confinement heterostructure S1. As depicted in FIG. 12 and FIG. 13, the first graded-index layer G1 is arranged between the buffer layer B and the first cladding layer CL1. In the embodiment, the first cladding layer CL1 comprises a material of AlGaAs and the composition of the chemical formula is $Al_{0.4}Ga_{0.6}As$. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 230.

Figure 14:
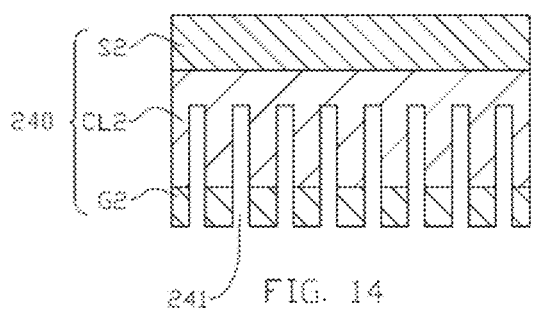
FIG. 14 is a schematic diagram of a second waveguiding layer 240 according to an embodiment of the present disclosure.

FIG. 14 is a schematic diagram of a second waveguiding layer 240 according to an embodiment. The second waveguiding layer 240 comprises a second graded-index layer G2, a second cladding layer CL2, and a second separate confinement heterostructure S2. As depicted in FIGS. 12-14, the second separate confinement heterostructure S2 is arranged between the active layer 230 and the second cladding layer CL2. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the second cladding layer CL2 and the contact layer C. The second cladding layer CL2, the second graded-index layer G2, and the contact layer C are fabricated with a plurality of holes 241 therein to form the photonic crystal structure 250. In the embodiment, the second cladding layer CL2 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the second cladding layer CL2 is 200 nm and a thickness of the second graded-index layer G2 is 150 nm. However, the invention is not limited thereto.

Referring to FIGS. 12-14, the epitaxy structure W is therefore fabricated by the first graded-index layer G1, the first cladding layer CL1, the first separate confinement heterostructure S1, the active layer 230, the second separate confinement heterostructure S2, the second cladding layer CL2, the second graded-index layer G2, and the contact layer C, but the number of layers of the epitaxy structure W is not limited. For example, in some embodiments, the epitaxy structure W may further include the substrate 210 and the buffer layer B. Moreover, the second waveguiding layer 240 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the light-transmissive conducting layer 270. The first waveguiding layer 220 is an n-type semiconductor with silicon (Si) dopant at an amount of $10^{18}$ $cm^{-3}$. The materials fabricating the substrate 210, the buffer layer B, the first graded-index layer G1, the first cladding layer CL1, the first separate confinement heterostructure S1, the second separate confinement heterostructure S2, the second cladding layer CL2, the second graded-index layer G2, and the contact layer C also allow a wavelength of the laser to include blue and infrared lights.

In an embodiment, the periodicity a of the photonic crystal structure 250 is 385 nm, 388 nm, 390 nm, 393 nm or 395 nm, and a wavelength of emitted laser beam is around 1.3 μm. In another embodiment, the periodicity a of the photonic crystal structure 150 is 275 nm, and a wavelength of emitted laser beam is around 940 nm, but the invention is not limited thereto. In other words, the wavelength of emitted laser beam is variable since the wavelength becomes longer as the periodicity a of the photonic crystal structure 250 gets longer. On the other hand, the present invention does not require complex techniques of wafer fusion bonding and epitaxial regrowth for fabrication; instead, it has the epitaxy structure W etched from the top for fabrication of the photonic crystal structure 250 and has the photonic crystal structure 250 inversely disposed, so as to enable laser beams to be emitted from a rear surface of the epitaxy structure W and to bring features of surface-emission and narrow divergence angle.

Figure 15:
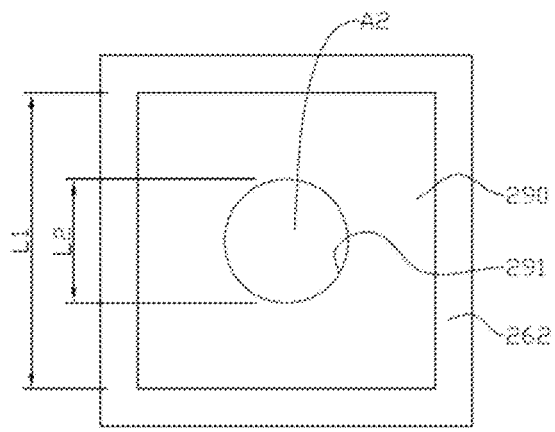
FIG. 15 is a schematic top plan view of the electrically pumped photonic crystal surface emitting laser device 200A or 200B according to an embodiment of the present disclosure.

FIG. 15 is a schematic top plan view of the electrically pumped photonic crystal surface emitting laser device 200A or 200B according to an embodiment of the present disclosure. An outer side length L1 and inner side length L2 of the second electrode 290 are respectively 650 μm and 300 μm, and the opening 291 exposes the second area A2 of the second insulating layer 262 therein. With the features disclosed above, in each of the embodiments, the light-transmissive conducting layer 270, the first electrode 280, the second electrode 290, the first insulating layer 260, and the second insulating layer 262 are electrically pumped to activate the quantum structure 231 of the active layer 230 to generate laser beams. In one direction, the laser beams are surface-emitted to the opening 291 of the second electrode 290. In the opposite direction, the laser beams are surface-emitted through the photonic crystal structure 250 to the first electrode 280; then the first electrode 280 reflect the laser beams to the light-transmissive conducting layer 270, the first aperture 261 of the first insulating layer 260, the first areas A1 of the photonic crystal structure 250, the second area A2 of the second insulating layer 262, and the opening 291 of the second electrode 290 on the electrically pumped photonic crystal surface emitting laser device 200A or 200B.

Figure 16:
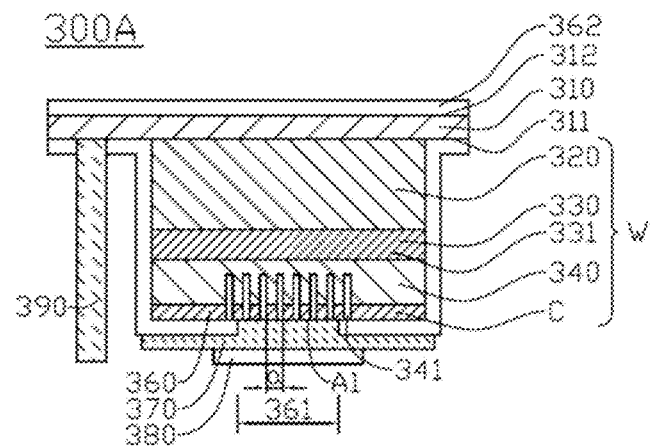
FIG. 16 is a schematic cross-sectional view of an electrically pumped photonic crystal surface emitting laser device 300A according to an embodiment of the present disclosure.
Figure 16A:
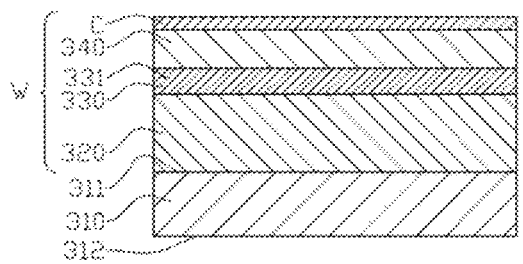
FIGS. 16A-16O are schematic cross-sectional views for forming the laser device 300A shown in FIG. 16.
Figure 16B:
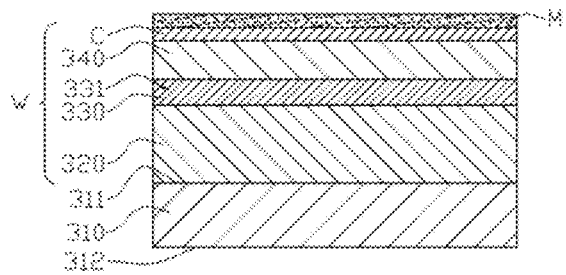
Figures 16N, 16O:
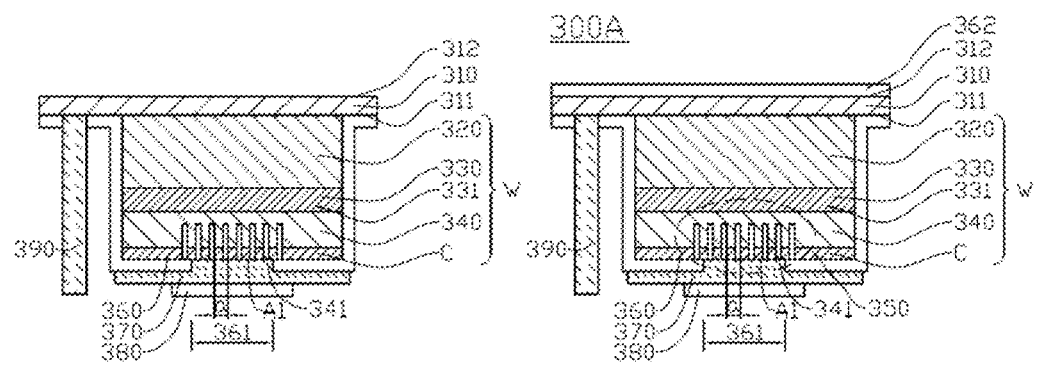
Figure 17:
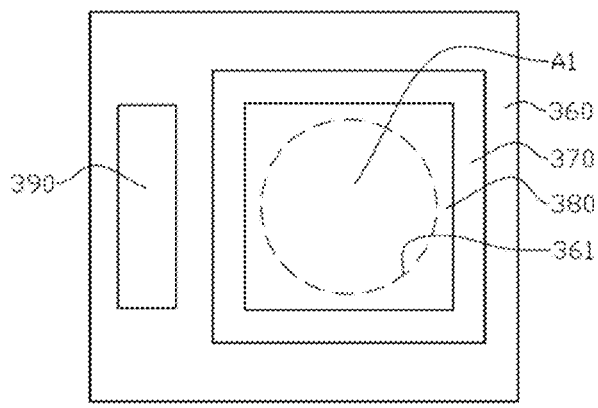
FIG. 17 is a schematic bottom plan view of the laser device 300A according to an embodiment of the present disclosure.
Figure 18:
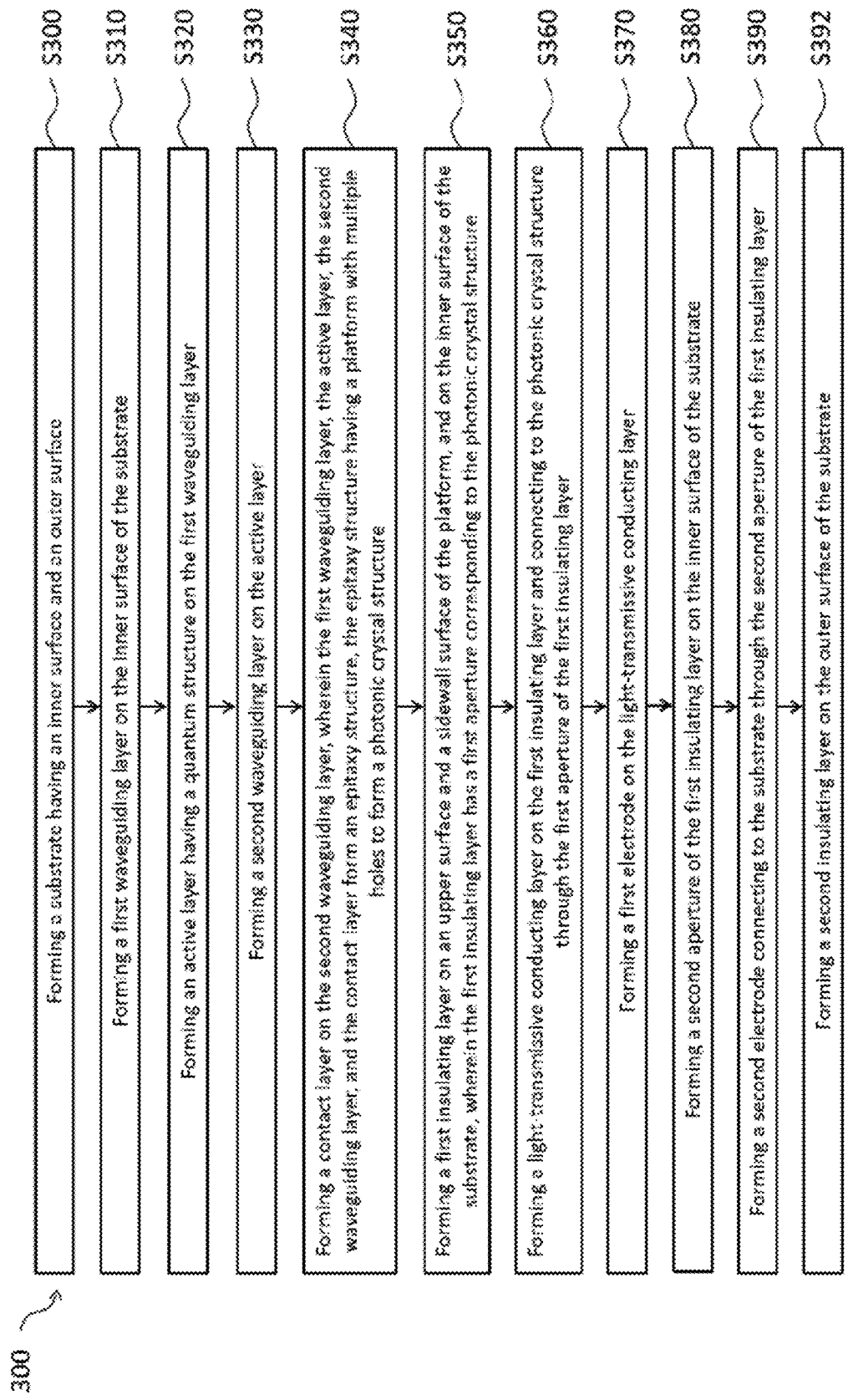
FIG. 18 is a schematic flowchart of a method 300 for forming the laser device 300A shown in FIG. 16 according to an embodiment of the present disclosure.

FIG. 16 is a schematic cross-sectional view of an electrically pumped photonic crystal surface emitting laser device 300A according to an embodiment of the present disclosure. FIGS. 16A-16O are schematic cross-sectional views for forming the laser device 300A shown in FIG. 16. FIG. 17 is a schematic bottom plan view of the laser device 300A according to an embodiment of the present disclosure. FIG. 18 is a schematic flowchart of a method 300 for forming the laser device 300A according to an embodiment of the present disclosure.

Referring to FIG. 16, the laser device 300A includes a substrate 310, a first waveguiding layer 320, an active layer 330, a second waveguiding layer 340, a contact layer C, a photonic crystal structure 350, a first insulating layer 360, a second insulating layer 362, a light-transmissive conducting layer 370, a first electrode 380, and a second electrode 390. In the embodiment, the first waveguiding layer 320 may include at least a N-type semiconductor layer, and the second waveguiding layer 340 may include at least a P-type semiconductor layer, but the invention is not limited thereto.

In the embodiment, the substrate 310 may be a N-type semiconductor substrate layer and has an inner surface 311 and an outer surface 312. The first waveguiding layer 320 is on the inner surface 311 of the substrate 310. The active layer 330 is on the first waveguiding layer 320 and has a quantum structure 331. the quantum structure 331 includes at least a layer of quantum dots, a layer of quantum wire, or a layer of quantum well. The second waveguiding layer 340 is on the active layer 330 and has a thickness between 10 to 3000 nm. The contact layer C is on the second waveguiding layer 340.

Figure 16C:
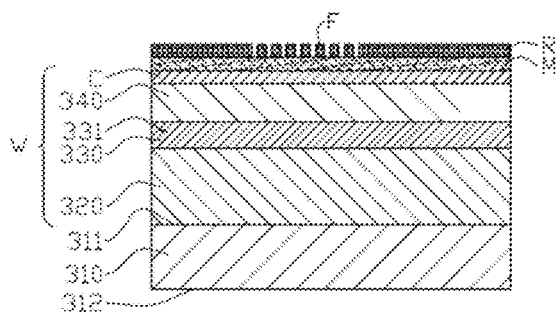
Figure 16D:
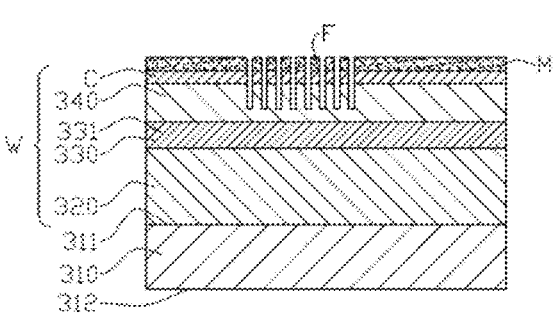
Figure 16E:
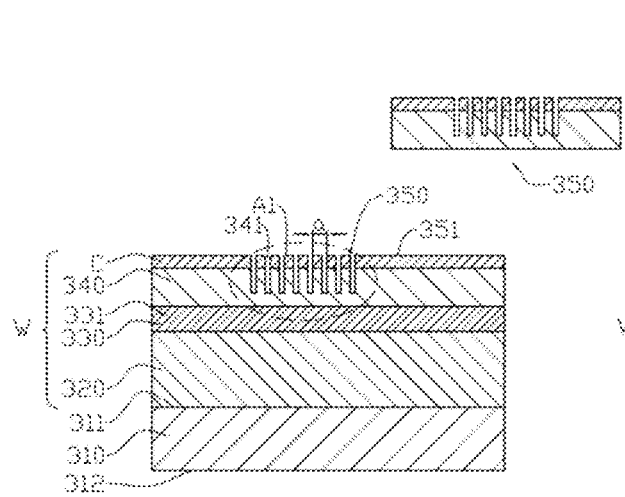
Figure 16F:
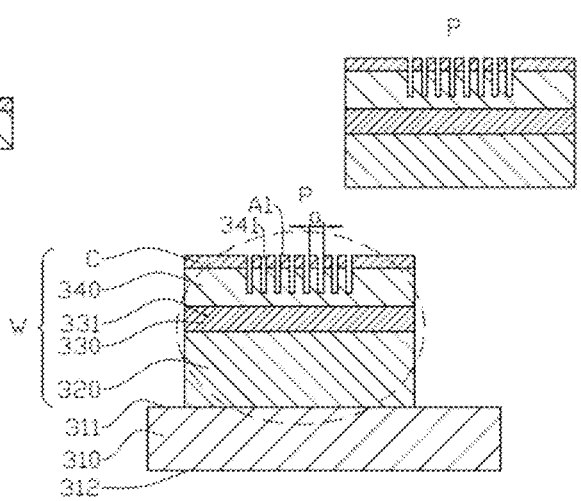

Referring to FIGS. 16A-16F and FIG. 18. As depicted in step S300, the method 300 begins at step S300 by forming a substrate 310 having an inner surface 311 and an outer surface 312. As depicted in step S310, the method 300 continues with step S310 by forming a first waveguiding layer 320 on the inner surface 311 of the substrate 310. As depicted in step S320, the method 300 continues with step S320 by forming an active layer 330 having a quantum structure 331 on the first waveguiding layer 320. As depicted in step S330, the method 300 continues with step S330 by forming a second waveguiding layer 340 on the active layer 330. As depicted in step S340, the method 300 continues with step S340 by forming a contact layer C on the second waveguiding layer 340, wherein the first waveguiding layer 320, the active layer 330, the second waveguiding layer 340, and the contact layer C form an epitaxy structure W, the epitaxy structure W having a platform P with multiple holes 341 to form a photonic crystal structure 350. Referring to FIG. 16A, the first waveguiding layer 320, the active layer 330, the second waveguiding layer 340, and the contact layer C fabricate an epitaxy structure W, but the number of layers of the epitaxy structure W is not limited. Further Referring to FIG. 16B, a hard mask M is fabricated by having silicon nitride ($SiN_x$) deposited on the epitaxy structure W, but the invention is not limited thereto. Referring to FIG. 16C, a photonic crystal pattern F is formed by having positive photoresist R applied on the epitaxy structure W within a square area of 290 μm, but the invention is not limited thereto. FIG. 16D illustrates the imprint of the photonic crystal pattern F. The photonic crystal pattern F is imprinted onto the hard mask M by dry etching, and then the positive photoresist R is removed; then the photonic crystal pattern F is further imprinted onto the epitaxy structure W by dry etching, too. Since a waveguide pattern of the quantum structure 331 mostly restricts the laser within the active layer 330, deep etching is required for the photonic crystal structure 350 to have a better coupling with the active layer 330. When the depth of etching is greater than 500 nm, the coupling efficiency of the photonic crystals is better, but the invention is not limited thereto. FIG. 16E further illustrates removal of the hard mask M. Referring to FIG. 16F, the epitaxy structure W is etched to form a platform P. The platform P further includes a plurality of holes 341 to form the photonic crystal structure 350 with a plurality of first areas A1 on a top surface 351 of the photonic crystal structure 350. The purpose of the platform P is to limit the laser beams within the photonic crystals and reduce leakage currents. In the embodiment, the periodicity a of the photonic crystal structure 350 is 385 nm, 388 nm, 390 nm, 393 nm or 395 nm. Additionally, the holes 341 of the platform P are arranged in a column shape with a depth of 520-540 nm and a diameter of 130-140 nm, and the holes 341 are arranged in 2-dimension, but the invention is not limited thereto. In another embodiment, the periodicity a of the photonic crystal structure 350 is 275 nm. Additionally, the holes 341 of the first platform P1 are arranged in a column shape with a depth of 520-540 nm and a diameter of 80-100 nm, and the holes 341 are arranged in 2-dimension, but the invention is not limited thereto.

Figure 16G:
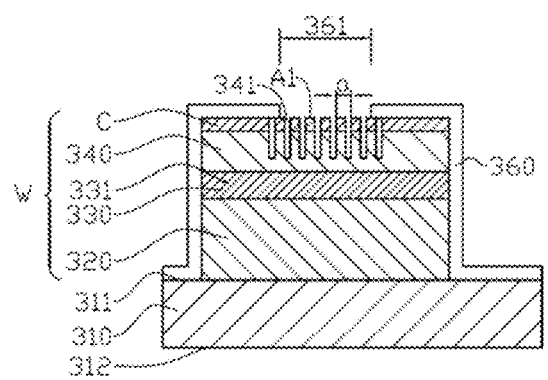

Still referring to FIG. 16G and FIG. 18, the method 300 continues with step S350 by a first insulating layer 360 on an upper surface and a sidewall surface of the platform P, and on the inner surface 311 of the substrate 310, wherein the first insulating layer 360 has a first aperture 361 corresponding to the photonic crystal structure 350. In some embodiments, the sidewall surface of the first platform P1 passes through the contact layer C, the second waveguiding layer 340, the active layer 330, and the first waveguiding layer 320. Therefore, the edges of contact layer C, the second waveguiding layer 340, the active layer 330, and the first waveguiding layer 320 are protected by the first insulating layer 360 from being exposed to the atmosphere. The first insulating layer 360 can prevent the interior structure from being oxidized in order to gain good reliability.

Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. Consequently, $SiN_x$ is deposited with a thickness of 120 nm, and then photolithography is applied to the present invention to fabricate a geometric pattern of a first aperture 361 in the middle of the first areas A1 of the photonic crystal structure 350 with a diameter of 150 μm. After removing unnecessary $SiN_x$ by lift-off or dry etching process, the first aperture 361 is fabricated correspondingly to the first areas A1 to confine electrical currents within the first areas A1.

Figure 16H:
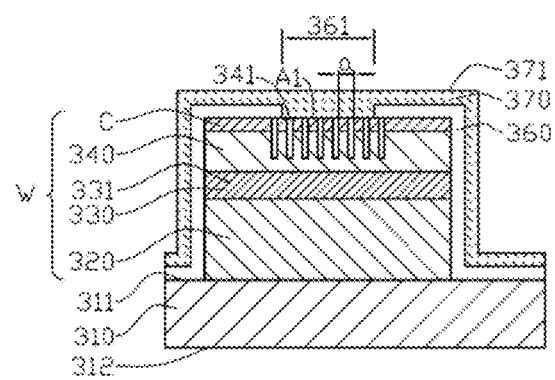
Figure 16I:
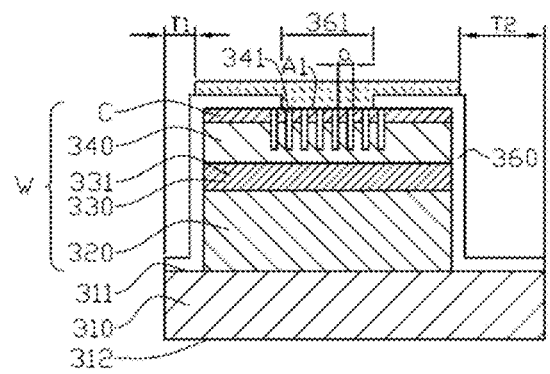

Still referring to FIGS. 16G-16I and FIG. 18, the method 300 continues with step S360 by forming a light-transmissive conducting layer 370 on the first insulating layer 360 and connecting to the photonic crystal structure 350 through the first aperture 361 of the first insulating layer 360. FIG. 16H illustrates the fabrication of the light-transmissive conducting layer 370. The light-transmissive conducting layer 370 is formed by having ITO fabricated with a thickness of 225 nm. The light-transmissive conducting layer 370 is on the first insulating layer 360 and covering the first areas A1 of the photonic crystal structure 350. After fabrication of the light-transmissive conducting layer 370, a trench T1 and a trench T2 are fabricated by photolithography to form a boundary for isolation. Then the light-transmissive conducting layer 370 in the trench T1 and trench T2 is removed by etching. T2 is wider than T1. In some embodiments, T1 is substantially equivalent to T2. In other embodiments, T1 is wider than T2. However, the invention is not limited thereto.

Figure 16J:
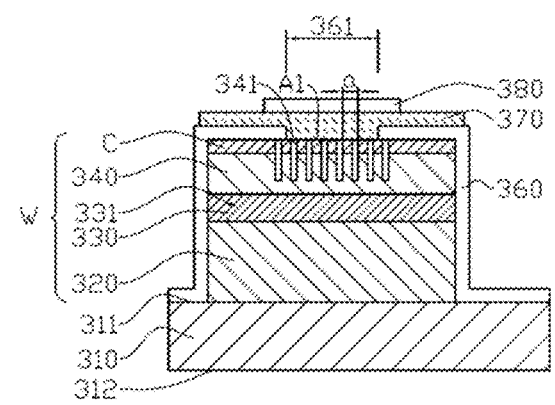

Still referring to FIG. 16J and FIG. 18, the method 300 continues with step S370 by forming a first electrode 380 on the light-transmissive conducting layer 370. An electrode pattern is fabricated by photolithography, and then titanium (Ti), platinum (Pt), and gold (Au) are deposited and removed by lift-off process to form the first electrode 380 on the light-transmissive conducting layer 370, but the invention is not limited thereto.

Figure 16K:
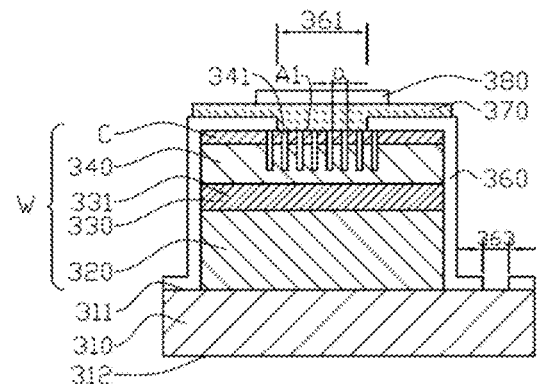

Still referring to FIG. 16K and FIG. 18, the method 300 continues with step S380 by forming a second aperture 363 of the first insulating layer 360 on the inner surface 311 of the substrate 310. The photolithography is applied to the present invention to fabricate a geometric pattern of the second aperture 363 on the first insulating layer 360. After removing unnecessary $SiN_x$ by lift-off or dry etching process, the second aperture 363 of the first insulating layer 360 is fabricated on the inner surface 311 of the substrate 310, but the invention is not limited thereto.

Figure 16L:
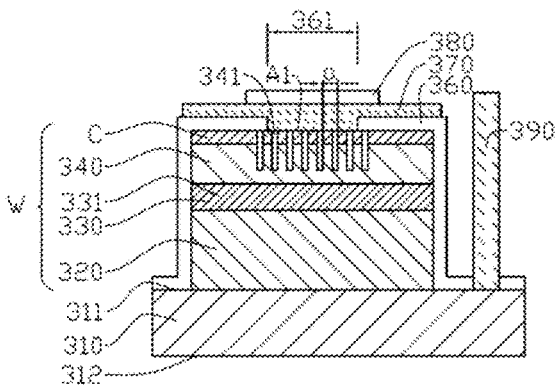
Figure 16M:
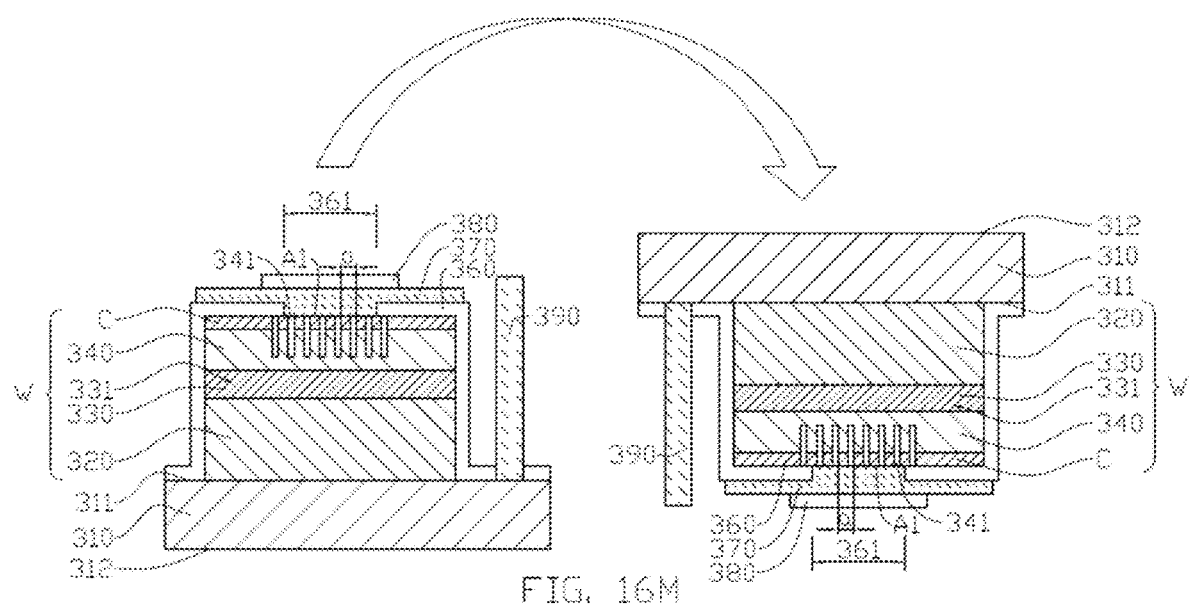

Still referring to FIG. 16L and FIG. 18, the method 300 continues with step S390 by forming a second electrode 390 connecting to the substrate 310 through the second aperture 363 of the first insulating layer 310. FIG. 16L illustrates the deposition of nickel (Ni), germanium (Ge), and gold (Au) to fabricate the second electrode 390 on the inner surface 311 of the substrate 310 and be protruded out of the second aperture 363, making the first electrode 380 and the second electrode 390 face substantially the same direction, but the invention is not limited thereto.

Still referring to FIGS. 16M-16O and FIG. 18, the epitaxy structure W and the substrate 310 are inversely disposed and the thickness of the substrate 310 is reduced for the outer surface 312 thereof to be a mirror-like surface, but the invention is not limited thereto. As depicted in step S392, the method 300 continues with step S392 by forming a second insulating layer 362 on the outer surface 312 of the substrate 310. the second insulating layer 362 is an anti-reflection layer, but the invention is not limited thereto. In another embodiment, the substrate 310 may be partially thinned at a region to form a treated substrate 310 having different thicknesses at different regions. For example, a first region of the treated substrate 310 directly above the photonic crystal structure 350 may be thinner than a second region of the treated substrate 310, and the first region may be surrounded by the second region to form a recess. The recess is corresponding to the photonic crystal structure 350. In such embodiment, the light absorption rised by the substrate 310 will decrease within the thinned first region of the treated substrate 310, and the strength of the epitaxy structure W can still be maintained because of the thicker second region of the treated substrate 310, but the invention is not limited thereto.

Referring to the embodiment of FIG. 17 and FIG. 16O, the laser device 300A is an asymmetric structure with the first electrode 380 at one side and the second electrode 390 at the other side. The first electrode 380 and the second electrode 390 face substantially the same direction, but the invention is not limited thereto.

FIG. 19 illustrates an electrically pumped photonic crystal surface emitting laser device 300B in another embodiment. FIG. 20 is a bottom plan view of the electrically pumped photonic crystal surface emitting laser device 300B. An outer side length L1 and inner side length L2 of the second electrode 390 are 650 μm and 300 μm, respectively. The first aperture 361 exposes the first areas A1 of the photonic crystal structure 350, but both the first aperture 361 and the first areas A1 are covered by the light-transmissive conducting layer 370 and the first electrode 380 therein. Referring to FIG. 19 and FIG. 20, the laser device 300B is a symmetric structure with the second electrode 390 surrounding the first electrode 380. Both the first electrode 380 and the second electrode 390 face substantially the same direction, but the invention is not limited thereto.

In some embodiments, a filled layer E (not shown in FIG. 16 and FIG. 19) is on the first insulating layer 360 around the first electrode 380 and the second electrode 390.

In some embodiments, a first connecting metal and a second connecting metal are on a top surface of a carrier (not shown in FIGS. 16 and 19). Then cover the substrate 310 on the carrier, further connect the first electrode 380 to the first connecting metal and connect the second electrode 390 to the second connecting metal, making the electrically pumped photonic crystal surface emitting laser device 300A become a flip chip. The carrier can be a pad, a die, a chip, a substrate, or a printed circuit board (PCB), but the invention is not limited thereto.

FIG. 21 is a schematic diagram of a first waveguiding layer 320 according to an embodiment. The first waveguiding layer 320 comprises a first graded-index layer G1, a first cladding layer CL1, and a first separate confinement heterostructure S1. As depicted in FIG. 19 and FIG. 21, the first graded-index layer G1 is arranged between the substrate 310 and the first cladding layer CL1. In the embodiment, the first cladding layer CL1 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 330.

FIG. 22 is a schematic diagram of a second waveguiding layer 340 according to an embodiment. The second waveguiding layer 340 comprises a second graded-index layer G2, a second cladding layer CL2, and a second separate confinement heterostructure S2. As depicted in FIG. 19 and FIGS. 21-22, the second separate confinement heterostructure S2 is arranged between the active layer 330 and the second cladding layer CL2. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the second cladding layer CL2 and the contact layer C. The second cladding layer CL2, the second graded-index layer G2, and the contact layer C are fabricated with a plurality of holes 341 therein to form the photonic crystal structure 350. In the embodiment, the second cladding layer CL2 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the second cladding layer CL2 is 200 nm and a thickness of the second graded-index layer G2 is 150 nm. However, the invention is not limited thereto.

Still referring to FIG. 19 and FIGS. 21-22, the epitaxy structure W is therefore fabricated by the first graded-index layer G1, the first cladding layer CL1, the first separate confinement heterostructure S1, the active layer 330, the second separate confinement heterostructure S2, the second cladding layer CL2, the second graded-index layer G2, and the contact layer C, but the number of layers of the epitaxy structure W is not limited. For example, in some embodiments, the epitaxy structure W may further include the substrate 310. Moreover, the second waveguiding layer 340 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the light-transmissive conducting layer 370. The first waveguiding layer 320 is an n-type semiconductor with silicon (Si) dopant at an amount of $10^{18}$ $cm^{-3}$. The materials fabricating the substrate 310, the first graded-index layer G1, the first cladding layer CL1, the first separate confinement heterostructure S1, the second separate confinement heterostructure S2, the second cladding layer CL2, the second graded-index layer G2, and the contact layer C also allow a wavelength of the laser to include blue and infrared lights.

In an embodiment, the periodicity a of the photonic crystal structure 350 is 385 nm, 388 nm, 390 nm, 393 nm or 395 nm, and a wavelength of emitted laser beam is around 1.3 μm. In another embodiment, the periodicity a of the photonic crystal structure 150 is 275 nm, and a wavelength of emitted laser beam is around 940 nm, but the invention is not limited thereto. In other words, the wavelength of emitted laser beam is variable since the wavelength becomes longer as the periodicity a of the photonic crystal structure 350 gets longer. On the other hand, the present invention does not require complex techniques of wafer fusion bonding and epitaxial regrowth for fabrication; instead, it has the epitaxy structure W etched from the top for fabrication of the photonic crystal structure 350 and has the photonic crystal structure 350 inversely disposed, so as to enable laser beams to be emitted from a rear surface of the epitaxy structure W and to bring features of surface-emission and narrow divergence angle.

With the features disclosed above, in each of the embodiments, the light-transmissive conducting layer 370, the first electrode 380, the second electrode 390, and the first insulating layer 360 are electrically pumped to activate the quantum structure 331 of the active layer 330 to generate laser beams. In one direction, the laser beams are surface-emitted to the second insulating layer 362. In the opposite direction, the laser beams are surface-emitted through the photonic crystal structure 350 to the first electrode 380; then the first electrode 380 reflect the laser beams to the light-transmissive conducting layer 370, the first aperture 361 of the first insulating layer 360, the first areas A1 of the photonic crystal structure 350, to the second insulating layer 362 on the electrically pumped photonic crystal surface emitting laser device 300A or 300B.

Figure 25:
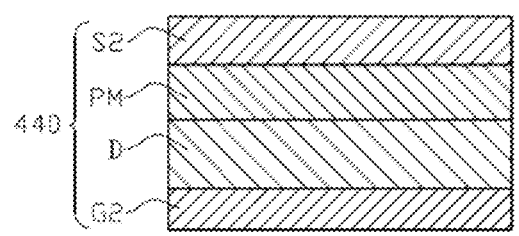
FIG. 25 is a schematic diagram of a second waveguiding layer 440 according to an embodiment of the present disclosure.
Figure 26:
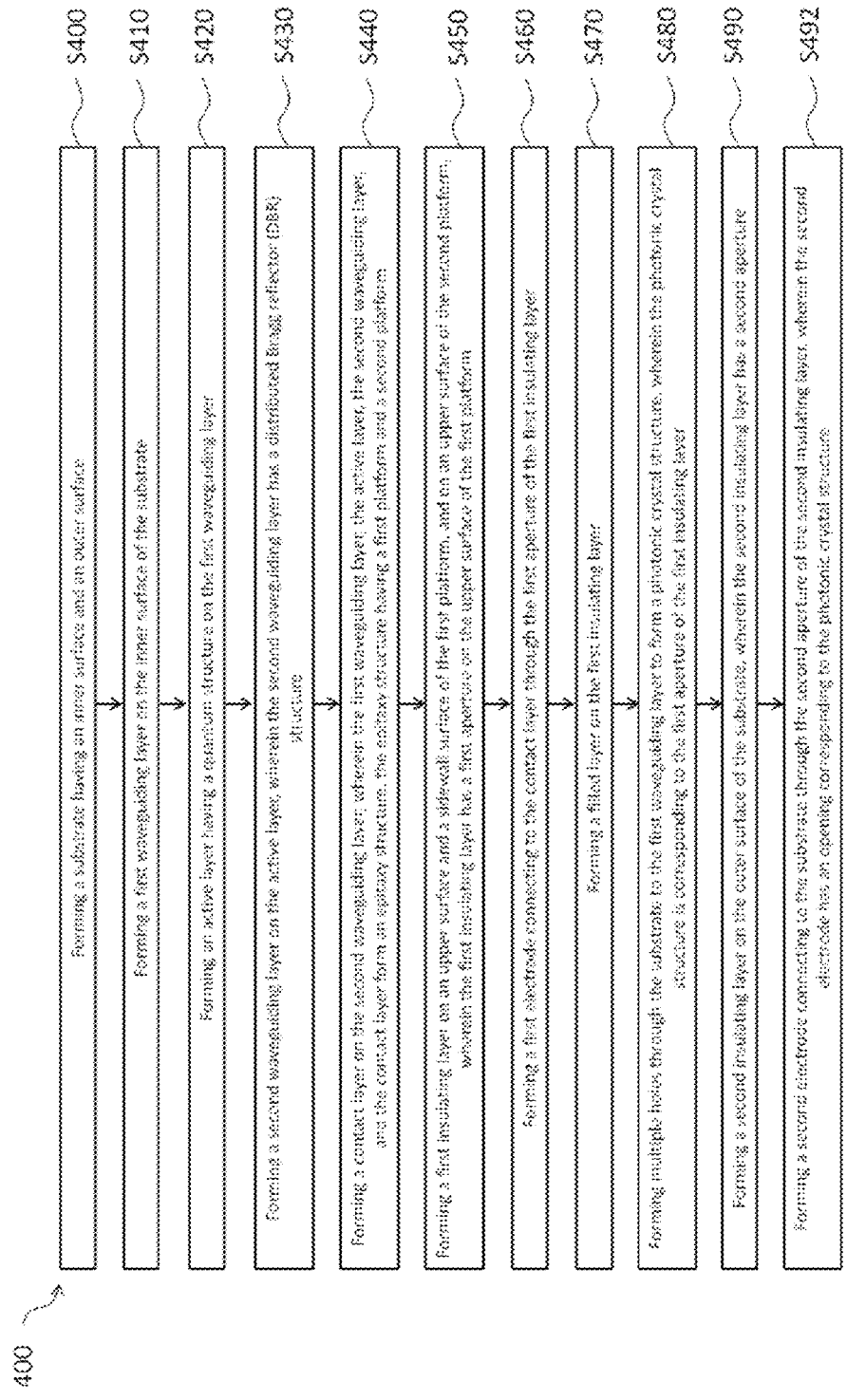
FIG. 26 is a schematic flowchart of a method 400 for forming the laser device 400A shown in FIG. 23 according to an embodiment of the present disclosure.

FIG. 23 is a schematic cross-sectional view of an electrically pumped photonic crystal surface emitting laser device 400A according to an embodiment of the present disclosure. FIG. 24 is a schematic diagram of a first waveguiding layer 420 according to an embodiment of the present disclosure. FIG. 25 is a schematic diagram of a second waveguiding layer 440 according to an embodiment of the present disclosure. FIG. 26 is a schematic flowchart of a method 400 for forming the laser device 400A according to an embodiment of the present disclosure. FIG. 27 is a schematic top plan view of the laser device 400A according to an embodiment of the present disclosure.

Referring to FIG. 23, the laser device 400A includes a substrate 410, a first waveguiding layer 420, an active layer 430, a second waveguiding layer 440, a contact layer C, a filled layer E, a photonic crystal structure 450, a first insulating layer 460, a second insulating layer 462, a first electrode 480, and a second electrode 490. In the embodiment, the first waveguiding layer 420 may include at least a N-type semiconductor layer, and the second waveguiding layer 440 may include at least a P-type semiconductor layer, but the invention is not limited thereto.

In the embodiment, the substrate 410 may be a N-type semiconductor substrate layer and has an inner surface 411 and an outer surface 412. The first waveguiding layer 420 is on the inner surface 411 of the substrate 410. The active layer 430 is on the first waveguiding layer 420 and has a quantum structure 431. the quantum structure 431 includes at least a layer of quantum dots, a layer of quantum wire, or a layer of quantum well. The second waveguiding layer 440 is on the active layer 430. The contact layer C is on the second waveguiding layer 440.

Referring to FIG. 23, the filled layer E is on the first insulating layer 460 around the first electrode 480.

In some embodiments, a connecting metal is on a top surface of a carrier (not shown in FIG. 23). Then cover the substrate 410 on the carrier, and further connect the first electrode 480 to the connecting metal. The carrier can be a pad, a die, a chip, a substrate, or a printed circuit board (PCB), but the present invention is not limited to such application.

Still referring to FIG. 23, for example, in an embodiment, a light-transmissive conducting layer may cover and contact an upper surface of the photonic crystal structure 450, and a side portion of the light-transmissive conducting layer may extend to electrically contact the second electrode 490. In a further embodiment, the substrate 410 may be partially thinned at a region to form a treated substrate 410 having different thicknesses at different regions. For example, a first region of the treated substrate 410 directly above the photonic crystal structure 450 may be thinner than a second region of the treated substrate 410, and the first region may be surrounded by the second region to form a recess. The recess is corresponding to the photonic crystal structure 450. In such embodiment, the light absorption rised by the substrate 410 will decrease within the thinned first region of the treated substrate 410. As aforementioned, a light-transmissive conducting layer may cover and contact an upper surface of the photonic crystal structure 450 within the recess, and the light-transmissive conducting layer extends from the bottom surface of the recess to the second insulating layer 462 on the outer surface 412 to electrically contact the second electrode 490. In addition, a portion of the light-transmissive conducting layer and a portion of the second electrode 490 may overlap at an inner side surface of the recess.

FIG. 24 is a schematic diagram of the first waveguiding layer 420 according to an embodiment. The first waveguiding layer 420 comprises a first graded-index layer G1, a first cladding layer CL1, and a first separate confinement heterostructure S1. As depicted in FIG. 23 and FIG. 24, the first graded-index layer G1 is arranged between the substrate 410 and the first cladding layer CL1. The substrate 410, the first graded-index layer G1, and the first cladding layer CL1 are fabricated with a plurality of holes 421 therein to form the photonic crystal structure 450. In the embodiment, the first cladding layer CL1 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 430. However, the invention is not limited thereto.

FIG. 25 is a schematic diagram of the second waveguiding layer 440 according to an embodiment. The second waveguiding layer 440 comprises a second graded-index layer G2, a distributed Bragg reflector (DBR) structure D, a phase matching layer PM, and a second separate confinement heterostructure S2. As depicted in FIGS. 23-25, the second separate confinement heterostructure S2 is arranged between the active layer 430 and the phase matching layer PM. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the DBR structure D and the contact layer C. However, the invention is not limited thereto.

FIG. 26 is a flowchart of a method 400 of forming the electrically pumped photonic crystal surface emitting laser device 400A according to an embodiment of the present disclosure. As depicted in step S400, the method 400 begins at step S400 by forming a substrate 410 having an inner surface 411 and an outer surface 412. As depicted in step S410, the method 400 continues with step S410 by forming a first waveguiding layer 420 on the inner surface 411 of the substrate 410. As depicted in step S420, the method 400 continues with step S420 by forming an active layer 430 having a quantum structure 431 on the first waveguiding layer 420. As depicted in step S430, the method 400 continues with step S430 by forming a second waveguiding layer 440 on the active layer 430, wherein the second waveguiding layer 440 has a distributed Bragg reflector (DBR) structure D. As depicted in step S440, the method 400 continues with step S440 by forming a contact layer C on the second waveguiding layer 440, wherein the first waveguiding layer 420, the active layer 430, the second waveguiding layer 440, and the contact layer C form an epitaxy structure W, the epitaxy structure W having a first platform P1 and a second platform P2. A first platform P1 and a second platform P2 are etched on the epitaxy structure W. The first platform P1 and the second platform P2 face substantially the same direction, but the invention is not limited thereto. As depicted in step S450, the method 400 continues with step S450 by forming a first insulating layer 460 on an upper surface and a sidewall surface of the first platform P1, and on an upper surface of the second platform P2, wherein the first insulating layer 460 has a first aperture 461 on the upper surface of the first platform P1. As depicted in step S460, the method 400 continues with step S460 by forming a first electrode 480 connecting to the contact layer C through the first aperture 461 of the first insulating layer 460. An electrode pattern is fabricated by photolithography, and then titanium (Ti), platinum (Pt), and gold (Au) are deposited and removed by lift-off process to form the first electrode 480. As depicted in step S470, the method 400 continues with step S470 by forming a filled layer E on the first insulating layer 460. The filled layer E is on the first insulating layer 460 around the first electrode 480. Then, the substrate 410 is inversely disposed, and the thickness of the substrate 410 is reduced for the outer surface 412 thereof to be a mirror-like surface. However, the invention is not limited thereto.

Still referring to FIG. 26, as depicted in step S480, the method 400 continues with step S480 by forming multiple holes 421 through the substrate 410 to the first waveguiding layer 420 to form a photonic crystal structure 450, wherein the photonic crystal structure 450 is corresponding to the first aperture 461 of the first insulating layer 460. The substrate 410 and the first waveguiding layer 420 have multiple holes 421 to form the photonic crystal structure 450 with a plurality of first areas A1 on a top surface of the photonic crystal structure 450. In the embodiment, the periodicity a of the photonic crystal structure 450 is 385 nm, 388 nm, 390 nm, 393 nm or 395 nm. Additionally, the holes 421 are arranged in a column shape with a depth of 520-540 nm and a diameter of 130-140 nm, and the holes 421 are arranged in 2-dimension, but the invention is not limited thereto. In another embodiment, the periodicity a of the photonic crystal structure 450 is 275 nm. Additionally, the holes 421 of the first platform P1 are arranged in a column shape with a depth of 520-540 nm and a diameter of 80-100 nm, and the holes 421 are arranged in 2-dimension, but the invention is not limited thereto. Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. As depicted in step S490, the method 400 continues with step S490 by forming a second insulating layer 462 on the outer surface 412 of the substrate 410, wherein the second insulating layer 462 has a second aperture 463. The photolithography is applied to the present invention to fabricate a geometric pattern of the second aperture 463 on the second insulating layer 462. After removing unnecessary $SiN_x$ by lift-off or dry etching process, the second aperture 463 is fabricated surrounding a middle portion of the second insulating layer 462. In the embodiment, the second insulating layer 462 is an anti-reflection layer, but the invention is not limited thereto. As depicted in step S492, the method 400 continues with step S492 by forming a second electrode 490 connecting to the substrate 410 through the second aperture 463 of the second insulating layer 462, wherein the second electrode 490 has an opening 491 corresponding to the photonic crystal structure 450. An electrode pattern is fabricated by photolithography, and then titanium (Ti), platinum (Pt), and gold (Au) are deposited and removed by lift-off process to form the second electrode 490 on the second insulating layer 462, the second electrode 490 connecting to the substrate 410 through the second aperture 463 of the second insulating layer 462. The second electrode 490 has an opening 491 corresponding to a second area A2 on a top surface of the second insulating layer 462 to avoid blocking the first areas A1 of the photonic crystal structure 450, so as to form the electrically pumped photonic crystal surface emitting laser device 400A. Then the electrically pumped photonic crystal surface emitting laser device 400A is fabricated after rapid thermal annealing process. Still, the invention is not limited thereto.

Referring to FIGS. 23-25, the epitaxy structure W is therefore fabricated by the first graded-index layer G1, the first cladding layer CL1, the first separate confinement heterostructure S1, the active layer 430, the second separate confinement heterostructure S2, the phase matching layer PM, the DBR structure D, the second graded-index layer G2, and the contact layer C, but the number of layers of the epitaxy structure W is not limited. For example, in some embodiments, the epitaxy structure W may further include the substrate 410. Moreover, the second waveguiding layer 440 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the first electrode 480. The first waveguiding layer 420 is an n-type semiconductor with silicon (Si) dopant at an amount of $10^{18}$ $cm^{-3}$. The materials fabricating the substrate 410, the first graded-index layer G1, the first cladding layer CL1, the first separate confinement heterostructure S1, the second separate confinement heterostructure S2, the phase matching layer PM, the DBR structure D, the second graded-index layer G2, and the contact layer C also allow a wavelength of the laser to include blue and infrared lights.

In an embodiment, the periodicity a of the photonic crystal structure 450 is 385 nm, 388 nm, 390 nm, 393 nm or 395 nm, and a wavelength of emitted laser beam is around 1.3 μm. In another embodiment, the periodicity a of the photonic crystal structure 150 is 275 nm, and a wavelength of emitted laser beam is around 940 nm, but the invention is not limited thereto. In other words, the wavelength of emitted laser beam is variable since the wavelength becomes longer as the periodicity a of the photonic crystal structure 450 gets longer. On the other hand, the present invention does not require complex techniques of wafer fusion bonding and epitaxial regrowth for fabrication; instead, it has the substrate 410 etched from the outer surface 412 for fabrication of the photonic crystal structure 450, so as to enable laser beams to be emitted from a rear surface of the epitaxy structure W and to bring features of surface-emission and narrow divergence angle.

FIG. 27 is a bottom plan view of the electrically pumped photonic crystal surface emitting laser device 400A. As shown in FIG. 27, an outer side length L1 and inner side length L2 of the second electrode 490 are respectively 650 μm and 300 μm, and the opening 491 exposes the second area A2 of the second insulating layer 462 therein. With the features disclosed above, in each of the embodiments, the first electrode 480, the second electrode 490, the first insulating layer 460, and the second insulating layer 462 are electrically pumped to activate the quantum structure 431 of the active layer 430 to generate laser beams. In one direction, the laser beams are surface-emitted through the photonic crystal structure 450 to the opening 491 of the second electrode 490. In the opposite direction, the laser beams are surface-emitted to the second waveguiding layer 440; then the DBR structure D of second waveguiding layer 440 reflect the laser beams to the first areas A1 of the photonic crystal structure 450, the second area A2 of the second insulating layer 462, and to the opening 491 of the second electrode 490 on the electrically pumped photonic crystal surface emitting laser device 400A.

Figure 31:
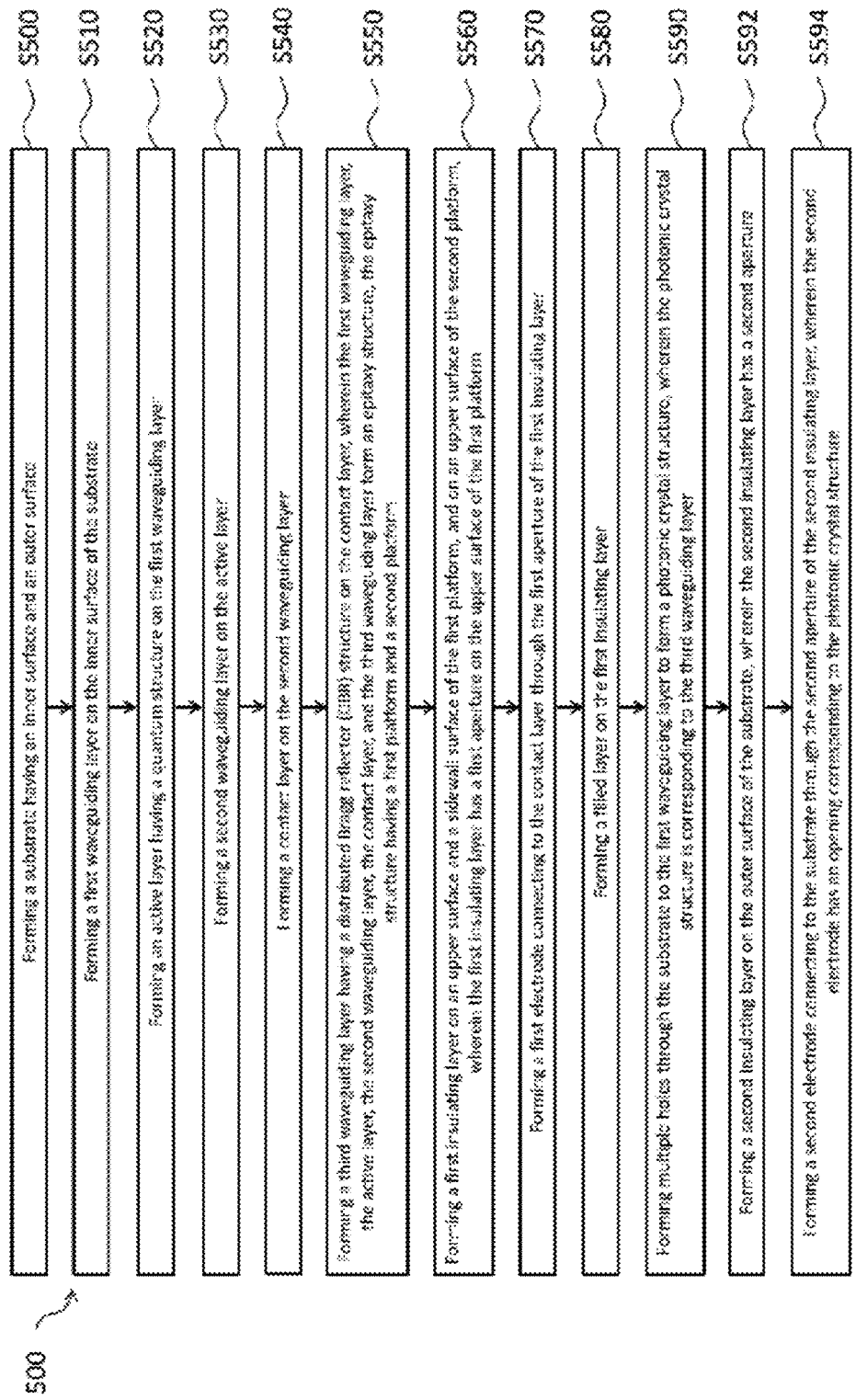
FIG. 31 is a schematic flowchart of a method 500 for forming the laser device 500A shown in FIG. 28 according to an embodiment of the present disclosure.

FIG. 28 is a schematic cross-sectional view of an electrically pumped photonic crystal surface emitting laser device 500A according to an embodiment of the present disclosure. FIG. 29 is a schematic diagram of a first waveguiding layer 520 according to an embodiment of the present disclosure. FIG. 30 is a schematic diagram of a second waveguiding layer 540 according to an embodiment of the present disclosure. FIG. 31 is a schematic flowchart of a method 500 for forming the laser device 500A according to an embodiment of the present disclosure. FIG. 32 is a schematic top plan view of the laser device 500A according to an embodiment of the present disclosure.

Referring to FIG. 28, the laser device 500A includes a substrate 510, a first waveguiding layer 520, an active layer 530, a second waveguiding layer 540, a third waveguiding layer 570, a contact layer C, a filled layer E, a photonic crystal structure 550, a first insulating layer 560, a second insulating layer 562, a first electrode 580, and a second electrode 590. In the embodiment, the first waveguiding layer 520 may include at least a N-type semiconductor layer, and the second waveguiding layer 540 may include at least a P-type semiconductor layer, but the invention is not limited thereto.

In the embodiment, the substrate 510 may be a N-type semiconductor substrate layer and has an inner surface 511 and an outer surface 512. The first waveguiding layer 520 is on the inner surface 511 of the substrate 510. The active layer 530 is on the first waveguiding layer 520 and has a quantum structure 531. The quantum structure 531 includes at least a layer of quantum dots, a layer of quantum wire, or a layer of quantum well. The second waveguiding layer 540 is on the active layer 530 and has a thickness between 10 to 3000 nm. The contact layer C is on the second waveguiding layer 540. The third waveguiding layer 570 is on the contact layer C. The third waveguiding layer 570 comprises a distributed Bragg reflector (DBR) structure D. The filled layer E is on the first insulating layer 560 around the first electrode 580.

In some embodiments, a connecting metal is on a top surface of a carrier (not shown in FIG. 28). Then cover the substrate 510 on the carrier, and further connect the first electrode 580 to the connecting metal. The carrier can be a pad, a die, a chip, a substrate, or a printed circuit board (PCB), but the present invention is not limited to such application.

Still referring to FIG. 28, for example, in an embodiment, a light-transmissive conducting layer may cover and contact an upper surface of the photonic crystal structure 550, and a side portion of the light-transmissive conducting layer may extend to electrically contact the second electrode 590. In a further embodiment, the substrate 510 may be partially thinned at a region to form a treated substrate 510 having different thicknesses at different regions. For example, a first region of the treated substrate 510 directly above the photonic crystal structure 550 may be thinner than a second region of the treated substrate 510, and the first region may be surrounded by the second region to form a recess. The recess is corresponding to the photonic crystal structure 550. In such embodiment, the light absorption rised by the substrate 510 will decrease within the thinned first region of the treated substrate 510. As aforementioned, a light-transmissive conducting layer may cover and contact an upper surface of the photonic crystal structure 550 within the recess, and the light-transmissive conducting layer extends from the bottom surface of the recess to the second insulating layer 562 on the outer surface 512 to electrically contact the second electrode 590. In addition, a portion of the light-transmissive conducting layer and a portion of the second electrode 590 may overlap at an inner side surface of the recess.

FIG. 29 is a schematic diagram of the first waveguiding layer 520 according to an embodiment. The first waveguiding layer 520 comprises a first graded-index layer G1, a first cladding layer CL1, and a first separate confinement heterostructure S1. As depicted in FIG. 28 and FIG. 29, the first graded-index layer G1 is arranged between the substrate 510 and the first cladding layer CL1. The substrate 510, the first graded-index layer G1, and the first cladding layer CL1 are fabricated with a plurality of holes 521 therein to form the photonic crystal structure 550. In the embodiment, the first cladding layer CL1 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 530. However, the invention is not limited thereto.

FIG. 30 is a schematic diagram of the second waveguiding layer 540 according to an embodiment. The second waveguiding layer 540 comprises a second graded-index layer G2, a phase matching layer PM, and a second separate confinement heterostructure S2. The phase matching layer PM is to reduce destructive interference. As depicted in FIGS. 28-30, the second separate confinement heterostructure S2 is arranged between the active layer 530 and the phase matching layer PM. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the phase matching layer PM and the contact layer C. However, the invention is not limited thereto.

FIG. 31 is a schematic flowchart of a method 500 for forming the laser device 500A according to an embodiment of the present disclosure. As depicted in step S500, the method 500 begins at step S500 by forming a substrate 510 having an inner surface 511 and an outer surface 512. As depicted in step S510, the method 500 continues with step S510 by forming a first waveguiding layer 520 on the inner surface 511 of the substrate 510. As depicted in step S520, the method 500 continues with step S520 by forming an active layer 530 having a quantum structure 531 on the first waveguiding layer 520. As depicted in step S530, the method 500 continues with step S530 by forming a second waveguiding layer 540 on the active layer 530. As depicted in step S540, the method 500 continues with step S540 by forming a contact layer C on the second waveguiding layer 540. As depicted in step S550, the method 500 continues with step S550 by forming a third waveguiding layer 570 having a distributed Bragg reflector (DBR) structure on the contact layer C, wherein the first waveguiding layer 520, the active layer 530, the second waveguiding layer 540, the contact layer C, and the third waveguiding layer 570 form an epitaxy structure W, the epitaxy structure W having a first platform P1 and a second platform P2. A first platform P1 and a second platform P2 are etched on the epitaxy structure W. The first platform P1 and the second platform P2 face substantially the same direction, but the invention is not limited thereto. As depicted in step S560, the method 500 continues with step S560 by forming a first insulating layer 560 on an upper surface and a sidewall surface of the first platform P1, and on an upper surface of the second platform P2, wherein the first insulating layer 560 has a first aperture 561 on the upper surface of the first platform P1. As depicted in step S570, the method 500 continues with step S570 by forming a first electrode 580 connecting to the contact layer C through the first aperture 561 of the first insulating layer 560. An electrode pattern is fabricated by photolithography, and then titanium (Ti), platinum (Pt), and gold (Au) are deposited and removed by lift-off process to form the first electrode 580. As depicted in step S580, the method 500 continues with step S580 by forming a filled layer E on the first insulating layer 560. The filled layer E is on the first insulating layer 560 around the first electrode 580. Then, the substrate 510 is inversely disposed, and the thickness of the substrate 510 is reduced for the outer surface 512 thereof to be a mirror-like surface. However, the invention is not limited thereto. As depicted in step S590, the method 500 continues with step S590 by forming multiple holes 521 through the substrate 510 to the first waveguiding layer 520 to form a photonic crystal structure 550, wherein the photonic crystal structure 550 is corresponding to the third waveguiding layer 570. The substrate 510 and the first waveguiding layer 520 have multiple holes 521 to form the photonic crystal structure 550 with a plurality of first areas A1 on a top surface of the photonic crystal structure 550. In the embodiment, the periodicity a of the photonic crystal structure 550 is 385 nm, 388 nm, 390 nm, 393 nm or 395 nm. Additionally, the holes 521 are arranged in a column shape with a depth of 520-540 nm and a diameter of 130-140 nm, and the holes 521 are arranged in 2-dimension, but the invention is not limited thereto. In another embodiment, the periodicity a of the photonic crystal structure 550 is 275 nm. Additionally, the holes 521 of the first platform P1 are arranged in a column shape with a depth of 520-540 nm and a diameter of 80-100 nm, and the holes 521 are arranged in 2-dimension, but the invention is not limited thereto. Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. As depicted in step S592, the method 500 continues with step S592 by forming a second insulating layer 562 on the outer surface 512 of the substrate 510, wherein the second insulating layer 562 has a second aperture 563. The photolithography is applied to the present invention to fabricate a geometric pattern of the second aperture 563 on the second insulating layer 562. After removing unnecessary $SiN_x$ by lift-off or dry etching process, the second aperture 563 is fabricated surrounding a middle portion of the second insulating layer 562. In the embodiment, the second insulating layer 562 is an anti-reflection layer, but the invention is not limited thereto. As depicted in step S594, the method 500 continues with step S594 by forming a second electrode 590 connecting to the substrate 510 through the second aperture 563 of the second insulating layer 562, wherein the second electrode 590 has an opening 591 corresponding to the photonic crystal structure 550. An electrode pattern is fabricated by photolithography, and then titanium (Ti), platinum (Pt), and gold (Au) are deposited and removed by lift-off process to form the second electrode 590 on the second insulating layer 562, the second electrode 590 connecting to the substrate 510 through the second aperture 563 of the second insulating layer 562. The second electrode 590 has an opening 591 corresponding to a second area A2 on a top surface of the second insulating layer 562 to avoid blocking the first areas A1 of the photonic crystal structure 550, so as to form the electrically pumped photonic crystal surface emitting laser device 500A. Then the electrically pumped photonic crystal surface emitting laser device 500A is fabricated after rapid thermal annealing process. Still, the invention is not limited thereto.

Still referring to FIGS. 28-30, the epitaxy structure W is therefore fabricated by the first graded-index layer G1, the first cladding layer CL1, the first separate confinement heterostructure S1, the active layer 530, the second separate confinement heterostructure S2, the phase matching layer PM, the second graded-index layer G2, the contact layer C, and the DBR structure D, but the number of layers of the epitaxy structure W is not limited. For example, in some embodiments, the epitaxy structure W may further include the substrate 510. Moreover, the second waveguiding layer 540 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the first electrode 580. The first waveguiding layer 520 is an n-type semiconductor with silicon (Si) dopant at an amount of $10^{18}$ $cm^{-3}$. The materials fabricating the substrate 510, the first graded-index layer G1, the first cladding layer CL1, the first separate confinement heterostructure S1, the second separate confinement heterostructure S2, the phase matching layer PM, the second graded-index layer G2, the contact layer C, and the DBR structure D also allow a wavelength of the laser to include blue and infrared lights.

In an embodiment, the periodicity a of the photonic crystal structure 550 is 385 nm, 388 nm, 390 nm, 393 nm or 395 nm, and a wavelength of emitted laser beam is around 1.3 μm. In another embodiment, the periodicity a of the photonic crystal structure 550 is 275 nm, and a wavelength of emitted laser beam is around 940 nm. In other words, the wavelength of emitted laser beam is variable since the wavelength becomes longer as the periodicity a of the photonic crystal structure 550 gets longer. On the other hand, the present invention does not require complex techniques of wafer fusion bonding and epitaxial regrowth for fabrication; instead, it has the substrate 510 etched from the outer surface 512 for fabrication of the photonic crystal structure 550, so as to enable laser beams to be emitted from a rear surface of the epitaxy structure W and to bring features of surface-emission and narrow divergence angle.

FIG. 32 is a bottom plan view of the electrically pumped photonic crystal surface emitting laser device 500A. As shown in FIG. 32, an outer side length L1 and inner side length L2 of the second electrode 590 are respectively 650 μm and 300 μm, and the opening 591 exposes the second area A2 of the second insulating layer 562 therein. With the features disclosed above, in each of the embodiments, the first electrode 580, the second electrode 590, the first insulating layer 560, and the second insulating layer 562 are electrically pumped to activate the quantum structure 531 of the active layer 530 to generate laser beams. In one direction, the laser beams are surface-emitted through the photonic crystal structure 550 to the opening 591 of the second electrode 590. In the opposite direction, the laser beams are surface-emitted to the third waveguiding layer 570; then the DBR structure D of the third waveguiding layer 570 reflect the laser beams to the first areas A1 of the photonic crystal structure 550, the second area A2 of the second insulating layer 562, and to the opening 591 of the second electrode 590 on the electrically pumped photonic crystal surface emitting laser device 500A.

Figure 36:
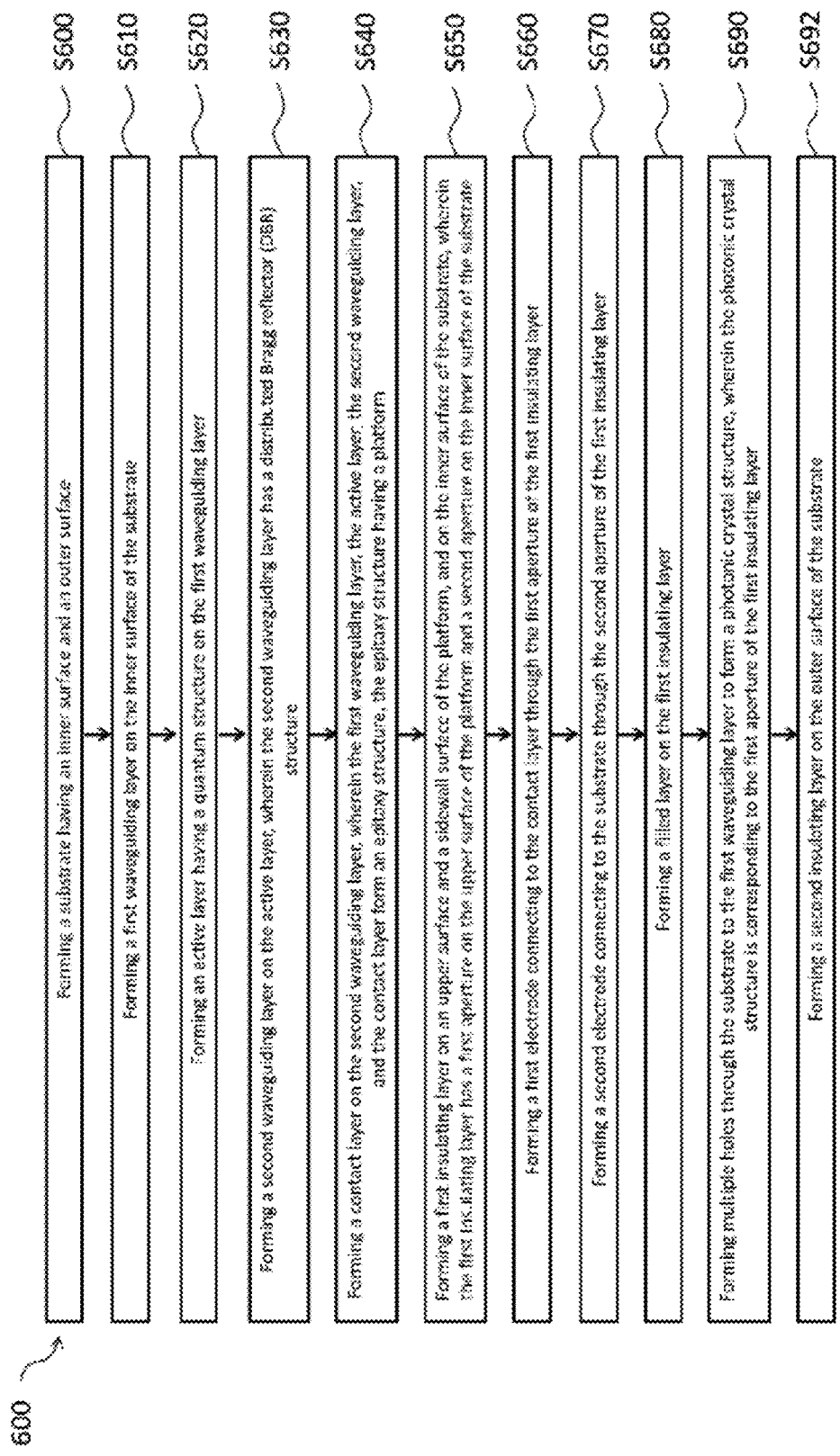
FIG. 36 is a schematic flowchart of a method 600 for forming the laser device 600A shown in FIG. 33 according to an embodiment of the present disclosure.

FIG. 33 is a schematic cross-sectional view of an electrically pumped photonic crystal surface emitting laser device 600A according to an embodiment. FIG. 34 is a schematic diagram of a first waveguiding layer 620 according to an embodiment. FIG. 35 is a schematic diagram of a second waveguiding layer 640 according to an embodiment. FIG. 36 is a schematic flowchart of a method 600 for forming the laser device 600A according to an embodiment. FIG. 37 is a schematic bottom plan view of the laser device 600A according to an embodiment.

Referring to FIG. 33, the laser device 600A includes a substrate 610, a first waveguiding layer 620, an active layer 630, a second waveguiding layer 640, a contact layer C, a filled layer E, a photonic crystal structure 650, a first insulating layer 660, a second insulating layer 662, a first electrode 680, and a second electrode 690. In the embodiment, the first waveguiding layer 620 may include at least a N-type semiconductor layer, and the second waveguiding layer 640 may include at least a P-type semiconductor layer, but the invention is not limited thereto.

In the embodiment, the substrate 610 may be a N-type semiconductor substrate layer and has an inner surface 611 and an outer surface 612. The first waveguiding layer 620 is on the inner surface 611 of the substrate 610. The active layer 630 is on the first waveguiding layer 620 and has a quantum structure 631. The quantum structure 631 includes at least a layer of quantum dots, a layer of quantum wire, or a layer of quantum well. The second waveguiding layer 640 is on the active layer 630 and has a thickness between 10 to 3000 nm. The contact layer C is on the second waveguiding layer 640. The filled layer E is on the first insulating layer 660 around the first electrode 680 and the second electrode 690.

In some embodiments, a first connecting metal and a second connecting metal are on a top surface of a carrier (not shown in FIG. 33). Then cover the substrate 610 on the carrier, further connect the first electrode 680 to the first connecting metal and connect the second electrode 690 to the second connecting metal, making the electrically pumped surface-emitting photonic crystal laser device 600A become a flip chip. The carrier can be a pad, a die, a chip, a substrate, or a printed circuit board (PCB), but the present invention is not limited to such application.

FIG. 34 is a schematic diagram of the first waveguiding layer 620 according to an embodiment. The first waveguiding layer 620 comprises a first graded-index layer G1, a first cladding layer CL1, and a first separate confinement heterostructure S1. As depicted in FIG. 33 and FIG. 34, the first graded-index layer G1 is arranged between the substrate 610 and the first cladding layer CL1. The substrate 610, the first graded-index layer G1, and the first cladding layer CL1 are fabricated with a plurality of holes 621 therein to form the photonic crystal structure 650. In the embodiment, the first cladding layer CL1 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the first cladding layer CL1 is 1.3 μm and a thickness of the first graded-index layer G1 is 150 nm. The first separate confinement heterostructure S1 is arranged between the first cladding layer CL1 and the active layer 630. However, the invention is not limited thereto.

FIG. 35 is a schematic diagram of the second waveguiding layer 640 according to an embodiment. The second waveguiding layer 640 comprises a second graded-index layer G2, a distributed Bragg reflector (DBR) structure D, a phase matching layer PM, and a second separate confinement heterostructure S2. As depicted in FIGS. 33-35, the second separate confinement heterostructure S2 is arranged between the active layer 630 and the phase matching layer PM. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the DBR structure D and the contact layer C. However, the invention is not limited thereto.

FIG. 36 is a flowchart of a method 600 of forming the electrically pumped photonic crystal surface emitting laser device 600A according to various aspects of the present disclosure. As depicted in step S600, the method 600 begins at step S600 by forming a substrate 610 having an inner surface 611 and an outer surface 612. As depicted in step S610, the method 600 continues with step S610 by forming a first waveguiding layer 620 on the inner surface 611 of the substrate 610. As depicted in step S620, the method 600 continues with step S620 by forming an active layer 630 having a quantum structure 631 on the first waveguiding layer 620. As depicted in step S630, the method 600 continues with step S630 by forming a second waveguiding layer 640 on the active layer 630, wherein the second waveguiding layer 640 has a distributed Bragg reflector (DBR) structure D. As depicted in step S640, the method 600 continues with step S640 by forming a contact layer C on the second waveguiding layer 640, wherein the first waveguiding layer 620, the active layer 630, the second waveguiding layer 640, and the contact layer C form an epitaxy structure W, the epitaxy structure W having a platform P. the platform P is etched on the epitaxy structure W, but the invention is not limited thereto. As depicted in step S650, the method 600 continues with step S650 by forming a first insulating layer 660 on an upper surface and a sidewall surface of the platform P, and on the inner surface of the substrate 610, wherein the first insulating layer 660 has a first aperture 661 on the upper surface of the platform P and a second aperture 663 on the inner surface of the substrate. I As depicted in step S660, the method 600 continues with step S660 by forming a first electrode 680 connecting to the contact layer C through the first aperture 661 of the first insulating layer 660. An electrode pattern is fabricated by photolithography, and then titanium (Ti), platinum (Pt), and gold (Au) are deposited and removed by lift-off process to form the first electrode 680. As depicted in step S670, the method 600 continues with step S670 by forming a second electrode 690 connecting to the substrate 610 through the second aperture 663 of the first insulating layer 660. Nickel (Ni), germanium (Ge), and gold (Au) are deposited to fabricate the second electrode 690 on the inner surface 611 of the substrate 610 and protruded out of the second aperture 363, making the first electrode 680 and the second electrode 690 face substantially the same direction, but the invention is not limited thereto. As depicted in step S680, the method 600 continues with step S680 by forming a filled layer E-on the first insulating layer 660. The filled layer E is on the first insulating layer 660 around the first electrode 680 and the second electrode 690. Then, the substrate 610 is inversely disposed, and the thickness of the substrate 610 is reduced for the outer surface 612 thereof to be a mirror-like surface. However, the invention is not limited thereto. As depicted in step S690, the method 600 continues with step S690 by forming multiple holes 621 through the substrate 610 to the first waveguiding layer 620 to form a photonic crystal structure 650, wherein the photonic crystal structure 650 is corresponding to the first aperture 661 of the first insulating layer 660. The substrate 610 and the first waveguiding layer 620 have multiple holes 621 to form the photonic crystal structure 650 with a plurality of first areas A1 on a top surface of the photonic crystal structure 650. In the embodiment, the periodicity a of the photonic crystal structure 650 is 385 nm, 388 nm, 390 nm, 393 nm or 395 nm. Additionally, the holes 621 are arranged in a column shape with a depth of 520-540 nm and a diameter of 130-140 nm, and the holes 621 are arranged in 2-dimension, but the invention is not limited thereto. In another embodiment, the periodicity a of the photonic crystal structure 650 is 275 nm. Additionally, the holes 621 of the first platform P1 are arranged in a column shape with a depth of 520-540 nm and a diameter of 80-100 nm, and the holes 621 are arranged in 2-dimension, but the invention is not limited thereto. Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. As depicted in step S692, the method 600 continues with step S692 by forming a second insulating layer 662 on the outer surface 612 of the substrate 610. In the embodiment, the second insulating layer 662 is an anti-reflection layer, but the invention is not limited thereto. Then the electrically pumped photonic crystal surface emitting laser device 600A is fabricated after rapid thermal annealing process. Still, the invention is not limited thereto.

In another embodiment, the substrate 610 may be partially thinned at a region to form a treated substrate 610 having different thicknesses at different regions. For example, a first region of the treated substrate 610 directly above the photonic crystal structure 650 may be thinner than a second region of the treated substrate 610, and the first region may be surrounded by the second region to form a recess. The recess is corresponding to the photonic crystal structure 650. In such embodiment, the light absorption by the substrate 610 will decrease within the thinned first region of the treated substrate 610, and the strength of the epitaxy structure W can still be maintained because of the thicker second region of the treated substrate 610, but the invention is not limited thereto.

Referring to FIGS. 33-35, the epitaxy structure W is therefore fabricated by the first graded-index layer G1, the first cladding layer CL1, the first separate confinement heterostructure S1, the active layer 630, the second separate confinement heterostructure S2, the phase matching layer PM, the DBR structure D, the second graded-index layer G2, and the contact layer C, but the number of layers of the epitaxy structure W is not limited. For example, in some embodiments, the epitaxy structure W may further include the substrate 610. Moreover, the second waveguiding layer 640 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the first electrode 680. The first waveguiding layer 620 is an n-type semiconductor with silicon (Si) dopant at an amount of $10^{18}$ cm$^{-3}$. The materials fabricating the substrate 610, the first graded-index layer G1, the first cladding layer CL1, the first separate confinement heterostructure S1, the second separate confinement heterostructure S2, the phase matching layer PM, the DBR structure D, the second graded-index layer G2, and the contact layer C also allow a wavelength of the laser to include blue and infrared lights.

In an embodiment, the periodicity a of the photonic crystal structure 650 is 385 nm, 388 nm, 390 nm, 393 nm or 395 nm, and a wavelength of emitted laser beam is around 1.3 µm, but the invention is not limited thereto. In another embodiment, the periodicity a of the photonic crystal structure 650 is 275 nm, and a wavelength of emitted laser beam is around 940 nm. In other words, the wavelength of emitted laser beam is variable since the wavelength becomes longer as the periodicity a of the photonic crystal structure 650 gets longer. On the other hand, the present invention does not require complex techniques of wafer fusion bonding and epitaxial regrowth for fabrication; instead, it has the substrate 610 etched from the outer surface 612 for fabrication of the photonic crystal structure 650, so as to enable laser beams to be emitted from a rear surface of the epitaxy structure W and to bring features of surface-emission and narrow divergence angle.

FIG. 37 is a bottom plan view of the electrically pumped photonic crystal surface emitting laser device 600A. As shown in FIG. 37, an outer side length L1 and inner side length L2 of the second electrode 690 are respectively 650 µm and 300 µm, and the first aperture 661 covered by the first electrode 680 is corresponding to the first areas A1 of the photonic crystal structure 650 therein. With the features disclosed above, the first electrode 680, the second electrode 690, and the first insulating layer 660 are electrically pumped to activate the quantum structure 631 of the active layer 630 to generate laser beams. In one direction, the laser beams are surface-emitted through the photonic crystal structure 650 to the second insulating layer 662. In the opposite direction, the laser beams are surface-emitted to the second waveguiding layer 640; then the DBR structure D of the second waveguiding layer 640 reflect the laser beams to the first areas A1 of the photonic crystal structure 650, and to the second insulating layer 662 on the electrically pumped photonic crystal surface emitting laser device 600A.

Figure 41:
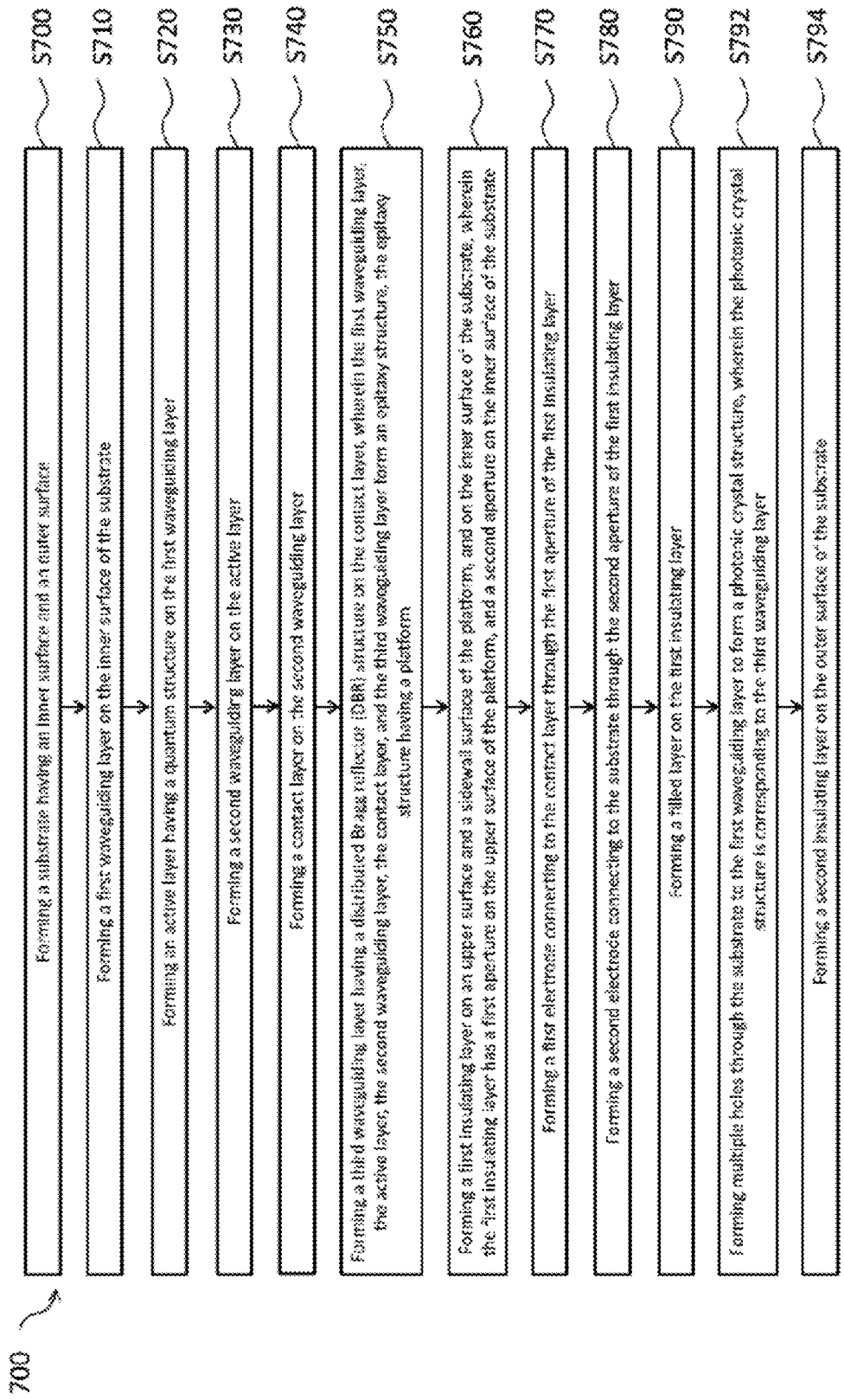
FIG. 41 is a schematic flowchart of a method 700 for forming the laser device 700A shown in FIG. 38 according to an embodiment of the present disclosure.
Figure 42:
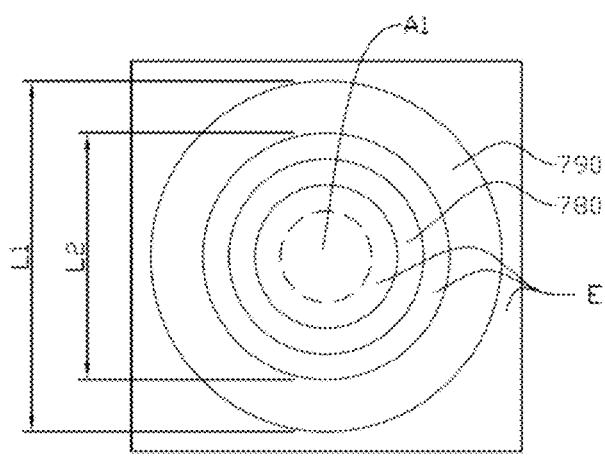
FIG. 42 is a schematic bottom plan view of the laser device 700A according to an embodiment of the present disclosure.

FIG. 38 is a schematic cross-sectional view of an electrically pumped photonic crystal surface emitting laser device 700A according to an embodiment of the present disclosure. FIG. 39 is a schematic diagram of a first waveguiding layer 720 according to an embodiment of the present disclosure. FIG. 40 is a schematic diagram of a second waveguiding layer 740 according to an embodiment of the present disclosure. FIG. 41 is a schematic flowchart of a method 700 for forming the laser device 700A shown in FIG. 38 according to an embodiment of the present disclosure. FIG. 42 is a schematic bottom plan view of the laser device 700A according to an embodiment of the present disclosure.

Referring to FIG. 38, the laser device 700A includes a substrate 710, a first waveguiding layer 720, an active layer 730, a second waveguiding layer 740, a contact layer C, a filled layer E, a photonic crystal structure 750, a first insulating layer 760, a second insulating layer 762, a first electrode 780, and a second electrode 790. In the embodiment, the first waveguiding layer 720 may include at least a N-type semiconductor layer, and the second waveguiding layer 740 may include at least a P-type semiconductor layer, but the invention is not limited thereto.

In the embodiment, the substrate 710 may be a N-type semiconductor substrate layer and has an inner surface 711 and an outer surface 712. The first waveguiding layer 720 is on the inner surface 711 of the substrate 710. The active layer 730 is on the first waveguiding layer 720 and has a quantum structure 731. the quantum structure 731 includes at least a layer of quantum dots, a layer of quantum wire, or a layer of quantum well. The second waveguiding layer 740 is on the active layer 730 and has a thickness between 10 to 3000 nm. The contact layer C is on the second waveguiding layer 740. The third waveguiding layer 770 is on the contact layer C. The third waveguiding layer 770 comprises a distributed Bragg reflector (DBR) structure D. The filled layer E is on the first insulating layer 760 around the first electrode 780 and the second electrode 790.

In some embodiments, a first connecting metal and a second connecting metal are on a top surface of a carrier (not shown in FIG. 38). Then cover the substrate 710 on the carrier, further connect the first electrode 780 to the first connecting metal and connect the second electrode 790 to the second connecting metal, making the electrically pumped surface-emitting photonic crystal laser device 700A become a flip chip. The carrier can be a pad, a die, a chip, a substrate, or a printed circuit board (PCB), but the present invention is not limited to such application.

FIG. 39 is a schematic diagram of the first waveguiding layer 720 according to an embodiment. The first waveguiding layer 720 comprises a first graded-index layer G1, a first cladding layer CL1, and a first separate confinement heterostructure S1. As depicted in FIG. 38 and FIG. 39, the first graded-index layer G1 is arranged between the substrate 710 and the first cladding layer CL1. The substrate 710, the first graded-index layer G1, and the first cladding layer CL1 are fabricated with a plurality of holes 721 therein to form the photonic crystal structure 750. In the embodiment, the first cladding layer CL1 comprises a material of AlGaAs and the composition of the chemical formula is Al0.4Ga0.6As. The proportion of aluminum is graded from 0.4 to 0.1 for the purpose of alleviation of barriers in-between the GaAs and the AlGaAs. A thickness of the first cladding layer CL1 is 1.3 µm and a thickness of the first graded-index layer G1 is 150 nm. The first separate confinement heterostructure S1 is arranged between the first cladding layer CL1 and the active layer 730. However, the invention is not limited thereto.

FIG. 40 is a schematic diagram of the second waveguiding layer 740 according to an embodiment. The second waveguiding layer 740 comprises a second graded-index layer G2, a phase matching layer PM, and a second separate confinement heterostructure S2. The phase matching layer PM is to reduce destructive interference. As depicted in FIGS. 38-40, the second separate confinement heterostructure S2 is arranged between the active layer 730 and the phase matching layer PM. The separate confinement heterostructures S1, S2 have a function of confining carriers and light field during operation. The first separate confinement heterostructure S1 has a thickness of 130 nm, and the second separate confinement heterostructure S2 has a thickness of 105 nm. The second graded-index layer G2 is arranged between the phase matching layer PM and the contact layer C. However, the invention is not limited thereto.

FIG. 41 is a flowchart of a method 700 for forming the laser device 700A according to an embodiment of the present disclosure. As depicted in step S700, the method 700 begins at step S700 by forming a substrate 710 having an inner surface 711 and an outer surface 712. As depicted in step S710, the method 700 continues with step S710 by forming a first waveguiding layer 720 on the inner surface 711 of the substrate 710. As depicted in step S720, the method 700 continues with step S720 by forming an active layer 730 having a quantum structure 731 on the first waveguiding layer 720. As depicted in step S730, the method 700 continues with step S730 by forming a second waveguiding layer 740 on the active layer 730. As depicted in step S740, the method 700 continues with step S740 by forming a contact layer C on the second waveguiding layer 740. As depicted in step S750, the method 700 continues with step S750 by forming a third waveguiding layer 770 having a distributed Bragg reflector (DBR) structure on the contact layer C, wherein the first waveguiding layer 720, the active layer 730, the second waveguiding layer 740, the contact layer C, and the third waveguiding layer 770 form an epitaxy structure W, the epitaxy structure W having a platform P. the platform P is etched on the epitaxy structure W, but the invention is not limited thereto. As depicted in step S760, the method 700 continues with step S760 by forming a first insulating layer 760 on an upper surface and a sidewall surface of the platform P, and on the inner surface of the substrate 710, wherein the first insulating layer 760 has a first aperture 761 on the upper surface of the platform P and a second aperture 763 on the inner surface of the substrate. As depicted in step S770, the method 700 continues with step S770 by forming a first electrode 780 connecting to the contact layer C through the first aperture 761 of the first insulating layer 760. An electrode pattern is fabricated by photolithography, and then titanium (Ti), platinum (Pt), and gold (Au) are deposited and removed by lift-off process to form the first electrode 780. As depicted in step S780, the method 700 continues with step S780 by forming a second electrode 790 connecting to the substrate 710 through the second aperture 763 of the first insulating layer 760. Nickel (Ni), germanium (Ge), and gold (Au) are deposited to fabricate the second electrode 790 on the inner surface 711 of the substrate 710 and protruded out of the second aperture 763, making the first electrode 780 and the second electrode 790 face substantially the same direction, but the invention is not limited thereto. As depicted in step S790, the method 700 continues with step S790 by forming a filled layer E on the first insulating layer 760. The filled layer E is on the first insulating layer 760 around the first electrode 780 and the second electrode 790. Then, the substrate 710 is inversely disposed, and the thickness of the substrate 710 is reduced for the outer surface 712 thereof to be a mirror-like surface. However, the invention is not limited thereto. As depicted in step S792, the method 700 continues with step S792 by forming multiple holes 721 through the substrate 710 to the first waveguiding layer 720 to form a photonic crystal structure 750, wherein the photonic crystal structure 750 is corresponding to the third waveguiding layer 770. The substrate 710 and the first waveguiding layer 720 have multiple holes 721 to form the photonic crystal structure 750 with a plurality of first areas A1 on a top surface of the photonic crystal structure 750. In the embodiment, the periodicity a of the photonic crystal structure 750 is 385 nm, 388 nm, 390 nm, 393 nm or 395 nm. Additionally, the holes 721 are arranged in a column shape with a depth of 520-540 nm and a diameter of 130-140 nm, and the holes 721 are arranged in 2-dimension, but the invention is not limited thereto. In another embodiment, the periodicity a of the photonic crystal structure 750 is 275 nm. Additionally, the holes 721 of the first platform P1 are arranged in a column shape with a depth of 520-540 nm and a diameter of 80-100 nm, and the holes 721 are arranged in 2-dimension, but the invention is not limited thereto. Since photonic crystals have infinite periodicity, theoretically, there would not be loss on boundaries. However, the photonic crystals for application actually have finite periodicity, so there would be loss on boundaries during operation. Therefore, to reduce the loss on boundaries during operation, an area of the photonic crystals is arranged to be greater than a gain area of the device. Additionally, the photonic crystals having an area 2-3 times greater than a gain area of the device can still produce laser beams successfully. As depicted in step S794, the method 700 continues with step S794 by forming a second insulating layer 762 on the outer surface 712 of the substrate 710. In the embodiment, the second insulating layer 762 is an anti-reflection layer, but the invention is not limited thereto. Then the electrically pumped photonic crystal surface emitting laser device 700A is fabricated after rapid thermal annealing process. Still, the invention is not limited thereto.

In another embodiment, the substrate 710 may be partially thinned at a region to form a treated substrate 710 having different thicknesses at different regions. For example, a first region of the treated substrate 710 directly above the photonic crystal structure 750 may be thinner than a second region of the treated substrate 710, and the first region may be surrounded by the second region to form a recess. The recess is corresponding to the photonic crystal structure 750. In such embodiment, the light absorption by the substrate 710 will decrease within the thinned first region of the treated substrate 710, and the strength of the epitaxy structure W can still be maintained because of the thicker second region of the treated substrate 710, but the invention is not limited thereto.

Referring to FIGS. 38-40, the epitaxy structure W is therefore fabricated by the first graded-index layer G1, the first cladding layer CL1, the first separate confinement heterostructure S1, the active layer 730, the second separate confinement heterostructure S2, the phase matching layer PM, the second graded-index layer G2, the contact layer C, and the DBR structure D, but the number of layers of the epitaxy structure W is not limited. For example, in some embodiments, the epitaxy structure W may further include the substrate 710. Moreover, the second waveguiding layer 740 is a p-type semiconductor with beryllium (Be) dopant, zinc (Zn) dopant, or carbon (C) dopant at an amount of $10^{18}$ $cm^{-3}$, and the contact layer C is heavily doped at an amount of $10^{19}$ $cm^{-3}$ for better ohmic contact with the first electrode 780. The first waveguiding layer 720 is an n-type semiconductor with silicon (Si) dopant at an amount of $10^{18}$ $cm^{-3}$. The materials fabricating the substrate 710, the first graded-index layer G1, the first cladding layer CL1, the first separate confinement heterostructure S1, the second separate confinement heterostructure S2, the phase matching layer PM, the second graded-index layer G2, the contact layer C, and the DBR structure D also allow a wavelength of the laser to include blue and infrared lights.

In an embodiment, the periodicity a of the photonic crystal structure 750 is 385 nm, 388 nm, 390 nm, 393 nm or 395 nm, and a wavelength of emitted laser beam is around 1.3 μm, but the invention is not limited thereto. In another embodiment, the periodicity a of the photonic crystal structure 150 is 275 nm, and a wavelength of emitted laser beam is around 940 nm. In other words, the wavelength of emitted laser beam is variable since the wavelength becomes longer as the periodicity a of the photonic crystal structure 750 gets longer. On the other hand, the present invention does not require complex techniques of wafer fusion bonding and epitaxial regrowth for fabrication; instead, it has the substrate 710 etched from the outer surface 712 for fabrication of the photonic crystal structure 750, so as to enable laser beams to be emitted from a rear surface of the epitaxy structure W and to bring features of surface-emission and narrow divergence angle.

FIG. 42 is a bottom plan view of the electrically pumped photonic crystal surface emitting laser device 700A. As shown in FIG. 42, an outer side length L1 and inner side length L2 of the second electrode 790 are respectively 650 µm and 300 µm, and the first areas A1 of the photonic crystal structure 750 is corresponding to the third waveguiding layer 770 as depicted in FIG. 38. With the features disclosed above, the first electrode 780, the second electrode 790, and the first insulating layer 760 are electrically pumped to activate the quantum structure 731 of the active layer 730 to generate laser beams. In one direction, the laser beams are surface-emitted through the photonic crystal structure 750 to the second insulating layer 762. In the opposite direction, the laser beams are surface-emitted to the third waveguiding layer 770; then the DBR structure D of the third waveguiding layer 770 reflects the laser beams to the first areas A1 of the photonic crystal structure 750, and to the second insulating layer 762 on the electrically pumped photonic crystal surface emitting laser device 700A.

In aforesaid embodiments, the substrate 110, 210, 310, 410, 510, 610, 710 may comprise a material selected from a group of gallium nitride (GaN), gallium arsenide (GaAs), indium phosphide (InP), and gallium antimonide (GaSb), but the invention is not limited thereto.

In aforesaid embodiments, the first waveguiding layer 120, 220, 320, 420, 520, 620, 720 may comprise a material selected from a group of aluminum gallium arsenide (AlGaAs), gallium arsenide (GaAs), indium gallium arsenide (InGaAs), gallium nitride (GaN), aluminum gallium nitride (AlGaN), indium gallium nitride (InGaN), aluminum gallium indium arsenide (AlGaInAs), indium phosphide (InP), gallium phosphide (GaP), indium gallium phosphide (InGaP), aluminum gallium indium phosphide (AlGaInP), gallium antimonide (GaSb), aluminum gallium antimonide (AlGaSb), gallium arsenide antimonide (GaAsSb), and aluminum gallium arsenide antimonide (AlGaAsSb), but the invention is not limited thereto.

In aforesaid embodiments, the second waveguiding layer 140, 240, 340, 440, 540, 640, 740 may comprise a material selected from a group of AlGaAs, GaAs, InGaAs, GaN, AlGaN, InGaN, AlGaInAs, InP, GaP, InGaP, AlGaInP, GaSb, AlGaSb, GaAsSb, and AlGaAsSb, but the invention is not limited thereto.

In aforesaid embodiments, the contact layer C may comprise a material selected from a group of GaN, GaAs, InP, InGaAs, GaP, GaSb, and indium gallium arsenide phosphide (InGaAsP), but the invention is not limited thereto.

In aforesaid embodiments, the light-transmissive conducting layer 170, 270, 370 may comprise a material selected from a group of indium tin oxide (ITO), antimony tin oxide (ATO), fluorine doped tin oxide (FTO), aluminum zinc oxide (AZO), gallium zinc oxide (GZO), indium zinc oxide (IZO), and zinc oxide (ZnO), but the invention is not limited thereto.

In aforesaid embodiments, the insulating layer 160, 260, 262, 360, 362, 460, 462, 560, 562, 660, 662, 760, 762 may comprise a material selected from a group of $SiN_x$, silicon oxide ($SiO_x$), aluminum oxide ($Al_2O_3$), and polyimide, but the invention is not limited thereto.

In aforesaid embodiments, the layer of quantum dots, the layer of quantum wire, and the layer of quantum well comprise at least a material selected from a group of gallium arsenide (GaAs), gallium phosphide (GaP), gallium nitride (GaN), indium arsenide (InAs), indium phosphide (InP), indium nitride (InN), indium gallium arsenide (InGaAs), indium gallium phosphide (InGaP), indium gallium nitride (InGaN), aluminium gallium arsenide (AlGaAs), aluminum gallium indium arsenide (AlGaInAs), aluminum gallium indium phosphide (AlGaInP), indium gallium aluminium nitride (InGaAlN), gallium indium arsenide phosphide (GaInAsP), indium antimonide (InSb), gallium antimonide (GaSb), aluminium antimonide (AlSb), gallium arsenide antimonide (GaAsSb), indium arsenide antimonide (InAsSb), aluminum arsenide antimonide (AlAsSb), gallium indium antimonide (GaInSb), aluminum gallium antimonide (AlGaSb), indium gallium arsenide antimonide (InGaAsSb), and aluminum gallium arsenide antimonide (AlGaAsSb), but the invention is not limited thereto.

In aforesaid embodiments, the first graded-index layer G1, the first cladding layer CL1, the first separate confinement heterostructure S1, the phase matching layer PM, the DBR structure D, the second graded-index layer G2, the second cladding layer CL2, and/or the second separate confinement heterostructure S2 may comprise a material selected from a group of aluminum gallium arsenide (AlGaAs), gallium arsenide (GaAs), indium gallium arsenide (InGaAs), gallium nitride (GaN), aluminum gallium nitride (AlGaN), indium gallium nitride (InGaN), aluminum gallium indium arsenide (AlGaInAs), indium phosphide (InP), gallium Phosphide (GaP), indium gallium phosphide (InGaP), aluminum gallium indium phosphide (AlGaInP), gallium antimonide (GaSb), aluminum gallium antimonide (AlGaSb), gallium arsenide antimonide (GaAsSb), and aluminum gallium arsenide antimonide (AlGaAsSb), but the invention is not limited thereto.

In aforesaid embodiments, the filled layer E comprises metal, polymer, or a material selected from a group of $SiN_x$, silicon oxide ($SiO_x$) and polyimide, but the invention is not limited thereto.

The aforesaid embodiments are not intended to limit the scope of the claimed invention. Those skilled in the art should realize the contents of the present invention can be modified, combined or displaced according to the demands of design and other factors. Any modification, replacement and improvement according to the spirit and principle of the present invention should be included in the scope of the present invention.

What is claimed is:
1. A laser device, comprising:
a substrate having an inner surface and an outer surface;
a first waveguiding layer over the inner surface of the substrate;
an active layer having a quantum structure over the first waveguiding layer;
a second waveguiding layer over the active layer;
a contact layer over the second waveguiding layer, wherein the first waveguiding layer, the active layer, the second waveguiding layer, and the contact layer form an epitaxy structure, the epitaxy structure having a first platform and a second platform, the first platform having multiple holes to form a photonic crystal structure;
an insulating layer over an upper surface and a sidewall surface of the first platform, and over an upper surface of the second platform, wherein the sidewall surface of the first platform passes through the contact layer, the second waveguiding layer, and the active layer, and wherein the insulating layer has an aperture corresponding to the photonic crystal structure;

a light-transmissive conducting layer over the insulating layer and connecting to the photonic crystal structure through the aperture of the insulating layer;

a first electrode over the light-transmissive conducting layer, wherein the first electrode has an opening corresponding to the aperture of the insulating layer; and a second electrode under the outer surface of the substrate.

2. The laser device of claim 1, wherein the first waveguiding layer comprises a graded-index layer, a cladding layer, and a separate confinement heterostructure.

3. The laser device of claim 1, wherein the first waveguiding layer comprises a graded-index layer, a distributed Bragg reflector structure, a phase matching layer, and a separate confinement heterostructure.

4. The laser device of claim 1, wherein the second waveguiding layer comprises a graded-index layer, a cladding layer, and a separate confinement heterostructure.

5. The laser device of claim 1, wherein the first waveguiding layer and the second waveguiding layer comprise at least a material selected from a group of aluminum gallium arsenide (AlGaAs), gallium arsenide (GaAs), indium gallium arsenide (InGaAs), gallium nitride (GaN), aluminum gallium nitride (AlGaN), indium gallium nitride (InGaN), aluminum gallium indium arsenide (AlGaInAs), indium phosphide (InP), gallium phosphide (GaP), indium gallium phosphide (InGaP), aluminum gallium indium phosphide (AlGaInP), gallium antimonide (GaSb), aluminum gallium antimonide (AlGaSb), gallium arsenide antimonide (GaAsSb), and aluminum gallium arsenide antimonide (AlGaAsSb).

6. The laser device of claim 1, wherein the quantum structure comprise at least a material selected from a group of gallium arsenide (GaAs), gallium phosphide (GaP), gallium nitride (GaN), indium arsenide (InAs), indium phosphide (InP), indium nitride (InN), indium gallium arsenide (InGaAs), indium gallium phosphide (InGaP), indium gallium nitride (InGaN), aluminium gallium arsenide (AlGaAs), aluminum gallium indium arsenide (AlGaInAs), aluminum gallium indium phosphide (AlGaInP), indium gallium aluminium nitride (InGaAlN), gallium indium arsenide phosphide (GaInAsP), indium antimonide (InSb), gallium antimonide (GaSb), aluminium antimonide (AlSb), gallium arsenide antimonide (GaAsSb), indium arsenide antimonide (InAsSb), aluminum arsenide antimonide (AlAsSb), gallium indium antimonide (GaInSb), aluminum gallium antimonide (AlGaSb), indium gallium arsenide antimonide (InGaAsSb), and aluminum gallium arsenide antimonide (AlGaAsSb).

7. The laser device of claim 1, wherein the contact layer comprises at least a material selected from a group of gallium nitride (GaN), gallium arsenide (GaAs), indium phosphide (InP), indium gallium arsenide (InGaAs), gallium phosphide (GaP), gallium antimonide (GaSb), and indium gallium arsenide phosphide (InGaAsP).

8. The laser device of claim 1, wherein the holes are arranged in 2-dimension.

9. The laser device of claim 1, wherein the insulating layer comprises at least a material selected from a group of silicon nitride ($SiN_x$), silicon oxide ($SiO_x$), aluminum oxide ($Al_2O_3$), and polyimide.

10. The laser device of claim 1, wherein the light-transmissive conducting layer comprises at least a material selected from a group of indium tin oxide (ITO), antimony tin oxide (ATO), fluorine doped tin oxide (FTO), aluminum zinc oxide (AZO), gallium zinc oxide (GZO), indium zinc oxide (IZO), and zinc oxide (ZnO).

11. The laser device of claim 1, wherein the sidewall surface of the first platform further passes through at least a portion of the first waveguiding layer.

12. The laser device of claim 1, wherein the first platform and the second platform face substantially the same direction.

13. A laser device, comprising:
a substrate having an inner surface and an outer surface;
a first waveguiding layer on the inner surface of the substrate;
an active layer having a quantum structure on the first waveguiding layer;
a second waveguiding layer on the active layer;
a contact layer on the second waveguiding layer, wherein the first waveguiding layer, the active layer, the second waveguiding layer, and the contact layer form an epitaxy structure, the epitaxy structure having a first platform and a second platform, the first platform having multiple holes to form a photonic crystal structure;
a first insulating layer on an upper surface and a sidewall surface of the first platform, and on an upper surface of the second platform, wherein the sidewall surface of the first platform passes through the contact layer, the second waveguiding layer, and the active layer, and wherein the first insulating layer has a first aperture corresponding to the photonic crystal structure;
a light-transmissive conducting layer on the first insulating layer and connecting to the photonic crystal structure through the first aperture of the first insulating layer;
a first electrode on the light-transmissive conducting layer;
a second insulating layer on the outer surface of the substrate, wherein the second insulating layer has a second aperture; and
a second electrode connecting to the substrate through the second aperture of the second insulating layer, wherein the second electrode has an opening corresponding to the first aperture of the first insulating layer.

14. The laser device of claim 13, wherein the sidewall surface of the first platform further passes through at least a portion of the first waveguiding layer.

15. The laser device of claim 13, wherein the first platform and the second platform face substantially the same direction.

16. A laser device, comprising:
a substrate having an inner surface and an outer surface;
a first waveguiding layer on the inner surface of the substrate;
an active layer having a quantum structure on the first waveguiding layer;
a second waveguiding layer on the active layer;
a contact layer on the second waveguiding layer, wherein the first waveguiding layer, the active layer, the second waveguiding layer, and the contact layer form an epitaxy structure, the epitaxy structure having a platform with multiple holes to form a photonic crystal structure;
a first insulating layer on an upper surface and a sidewall surface of the platform, and on the inner surface of the substrate, wherein the first insulating layer has a first aperture corresponding to the photonic crystal structure, and a second aperture on the inner surface of the substrate;

a light-transmissive conducting layer on the first insulating layer and connecting to the photonic crystal structure through the first aperture of the first insulating layer;

a first electrode on the light-transmissive conducting layer;

a second electrode connecting to the substrate through the second aperture of the first insulating layer; and a second insulating layer on the outer surface of the substrate.

17. The laser device of claim 16, wherein the first electrode and the second electrode face substantially the same direction.

18. The laser device of claim 16, wherein the laser device is an asymmetric structure with the first electrode at one side and the second electrode at the other side.

19. The laser device of claim 16, wherein the laser device is a symmetric structure with the second electrode surrounding the first electrode.

20. The laser device of claim 16, wherein the substrate further has a recess corresponding to the photonic crystal structure.

\* \* \* \* \*